(12) United States Patent
Tredwell

(10) Patent No.: US 8,558,185 B2
(45) Date of Patent: Oct. 15, 2013

(54) DIGITAL RADIOGRAPHIC DETECTOR ARRAY INCLUDING SPACERS AND METHODS FOR SAME

(75) Inventor: Timothy J. Tredwell, Fairport, NY (US)

(73) Assignee: Carestream Health, Inc., Rochester, NY (US)

( * ) Notice: Subject to any disclaimer, the term of this patent is extended or adjusted under 35 U.S.C. 154(b) by 35 days.

(21) Appl. No.: 12/973,991

(22) Filed: Dec. 21, 2010

(65) Prior Publication Data

US 2012/0153175 A1 Jun. 21, 2012

(51) Int. Cl.
*G01T 1/20* (2006.01)
(52) U.S. Cl.
USPC .............................. 250/370.09; 250/370.08
(58) Field of Classification Search
USPC ..................................................... 250/370.09
See application file for complete search history.

(56) References Cited

U.S. PATENT DOCUMENTS

| | | | |
|---|---|---|---|
| 4,621,271 A | 11/1986 | Brownstein | |
| 4,876,167 A | 10/1989 | Snow et al. | |
| 5,256,620 A | 10/1993 | Burberry et al. | |
| 5,506,409 A | 4/1996 | Yoshida et al. | |
| 6,469,305 B2 | 10/2002 | Takabayashi et al. | |
| 6,541,774 B1* | 4/2003 | DeJule et al. | 250/370.11 |
| 6,608,312 B1 | 8/2003 | Okada et al. | |
| 6,663,978 B1 | 12/2003 | Olson et al. | |
| 6,770,885 B2 | 8/2004 | Eberhard et al. | |
| 7,326,934 B2* | 2/2008 | Dorscheid et al. | 250/370.11 |
| 7,605,374 B2* | 10/2009 | Hoggatt et al. | 250/368 |
| 7,696,620 B2* | 4/2010 | Shibayama | 257/698 |
| 2007/0053493 A1* | 3/2007 | Bijlsma | 378/98.8 |
| 2007/0181252 A1* | 8/2007 | Bohm et al. | 156/297 |
| 2008/0099687 A1 | 5/2008 | Shoji et al. | |
| 2009/0108209 A1* | 4/2009 | Jung et al. | 250/370.11 |

FOREIGN PATENT DOCUMENTS

JP 2002/055165 A 2/2002

* cited by examiner

*Primary Examiner* — Marcus Taningco

(57) ABSTRACT

Embodiments relate to detector imaging arrays with scintillators (e.g., scintillating phosphor screens) mounted to imaging arrays. For example, the detector arrays comprise spacers to define a space between or separate the scintillator from the imaging array and a component of the imaging array is formed over the spacers. Embodiments according to present teachings can provide projection radiographic imaging apparatuses and methods including increased fill factors. Embodiments according to present teachings can provide projection radiographic imaging apparatuses, including a scintillator, an imaging array including a plurality of pixels formed over a substrate, and a plurality of spacers disposed between an active surface of the imaging array and the scintillator, where a component of the imaging array is over at least one of the spacers. The spacers can adjust light transmittance between the imaging array and the scintillator.

21 Claims, 16 Drawing Sheets

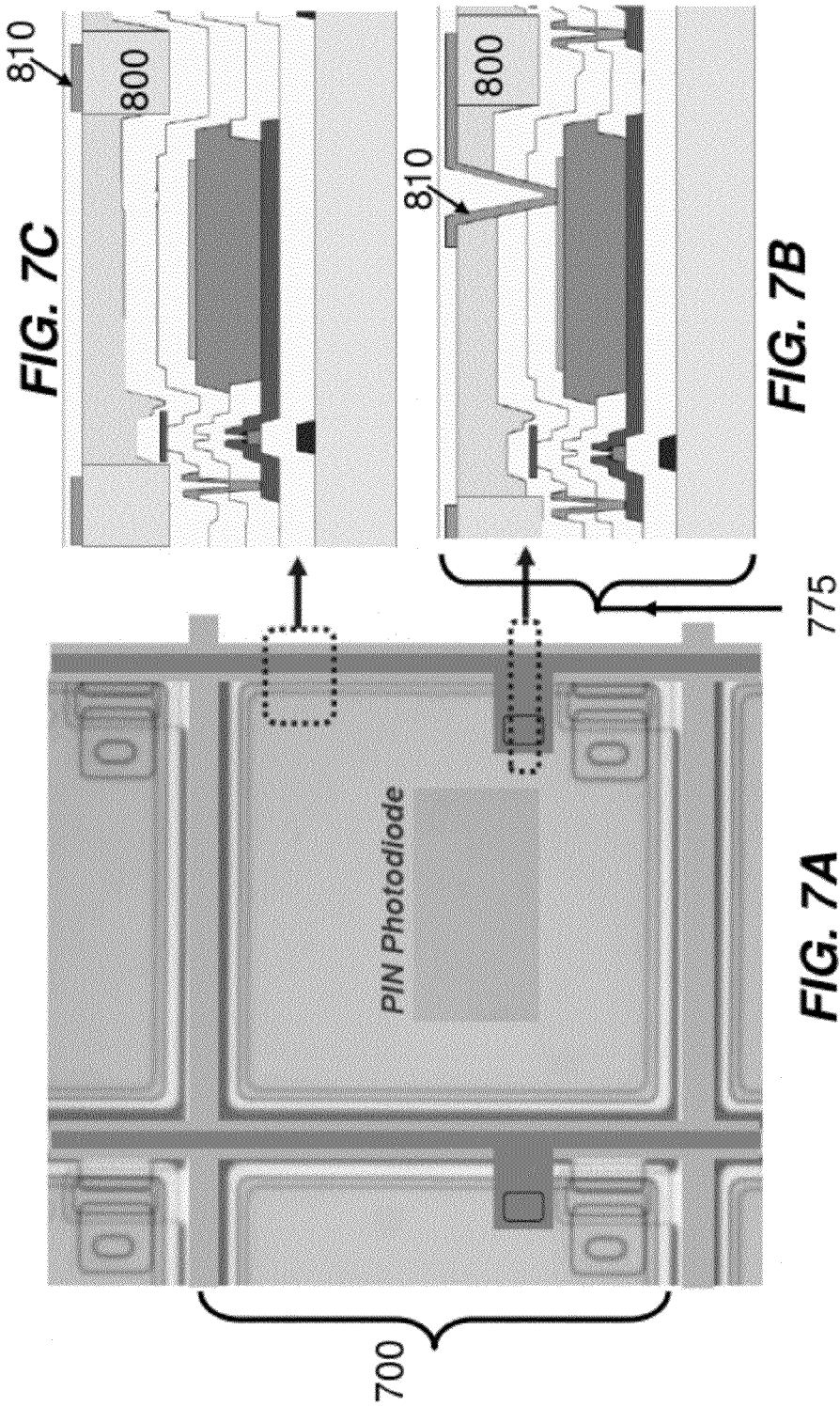

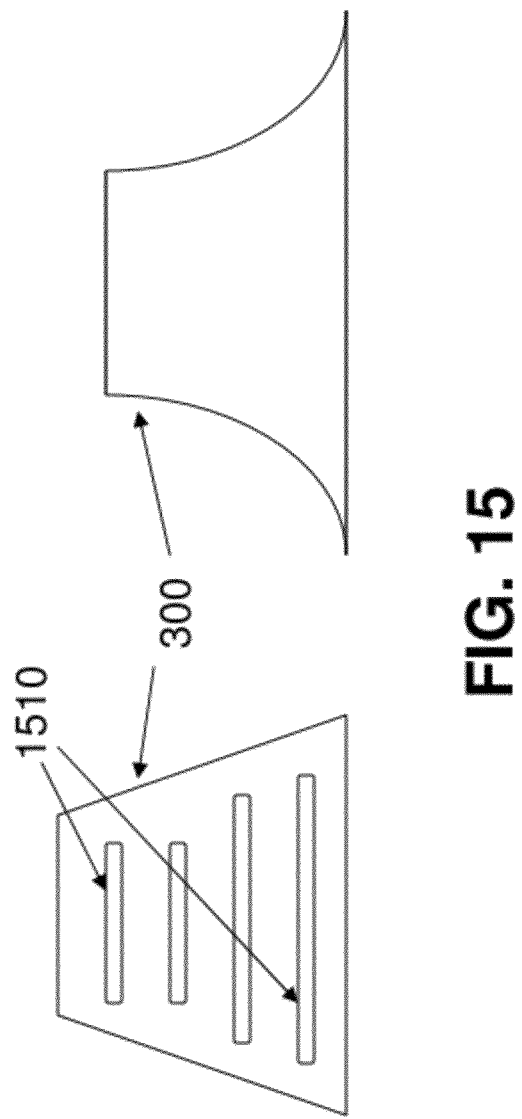

DIGITAL RADIOGRAPHIC DETECTOR ARRAY INCLUDING SPACERS AND METHODS FOR SAME

TECHNICAL FIELD

The present application relates to digital radiographic imaging arrays. More specifically, the present application relates to indirect digital radiographic imaging arrays and methods for using the same.

DESCRIPTION OF RELATED ART

An indirect digital radiographic (DR) detector can include a scintillator (e.g., phosphor scintillating screen) arranged in proximity to an imaging array sensitive to radiation emitted by the scintillator upon absorption of X-rays. In order to maintain high resolution, the scintillating screen can be mounted in contact with the imaging array or within about 1 micron of a surface of the imaging array. Greater spacing between the imaging array and the screen can result in a loss of resolution. For example, this loss of resolution can occur because of multiple reflections of light between the scintillator and the active surface of the imaging array (this phenomena is called light-piping). In addition, greater spacing or non-uniform spacing can result in image non-uniformity because of non-uniformity in optical coupling between the scintillator and the imaging array.

Digital radiographic imaging arrays have primarily been used in radiographic settings in which the detector is mounted inside a Potter-Bucky grid ("bucky") or mounted at a positioning arm. A bucky is a grid used in radiography that reduces or prevents scattered radiation from reaching the film, thereby securing better contrast and definition, and can move during exposure so that no lines appear in the radiograph. In these settings the imaging array is not subject to mechanical vibration or to shock. Recently, however, reductions in the size of digital radiography detectors and introduction of battery-powered imaging arrays with wireless communication have enabled highly portable imaging arrays that can be moved from one location to another. These digital radiography detectors subject the radiographic imaging array to increased shock and/or vibration. In addition, for some imaging procedures, the patient stands or lies on the detector, which can result in localized regions of high pressure. Finally, because of the portability, the opportunity for a detector to be dropped or subjected to shock can be greatly increased.

Two primary approaches have been conventionally used to attach a scintillator to an imaging array. In the first, the scintillator can be placed in physical contact with the imaging array using pressure between the non-active surface (substrate) of the imaging array and the substrate of the scintillator. The second approach uses an intermediary layer between the imaging array and the scintillator, for example, a planarization layer, an optical matching layer, an adhesive layer, etc., to attach the scintillator to the imaging array.

FIG. 1 illustrates the first of the two conventional techniques to attach a scintillator to an imaging array. In FIG. 1 an imaging array 175 is shown, including pixels 100. Each pixel 100 can include switching elements 150 and photosensing elements 140, as known in the art. Imaging array 175 can be formed on a glass substrate 130. Also shown in FIG. 1 is scintillating screen 180 formed on a substrate 120 (referred to herein as scintillator 110). Scintillator 110 can be placed over imaging array 175 and pressure can be applied to form an integrated digital detector 190. However, as can be seen in FIG. 1, a gap 160 can form between scintillator 110 and an active surface of imaging array 175. The active surface of imaging array 175 can display topography between the highest and lowest point of about 1 μm to about 3 μm. In addition, the surface of the scintillator 110 facing the active surface of the imaging array 175 can often display surface roughness on the order of several microns.

The arrangement shown in FIG. 1 can have various disadvantages. For example: 1) non-uniform optical contact between the scintillator 110 and the photosensing elements 140 in the imaging array 175 can result in non-uniformities in sensitivity to X-rays from pixel 100 to pixel 100; 2) mechanical grinding between the scintillator 110 and the imaging array 175 can result in damage to the scintillator 110 and/or the imaging array 175 when the scintillator 110 moves with respect to the imaging array 175; 3) lateral scattering of light because of reflections off the active surface of the imaging array 175 and the surface of the scintillator 110 facing the active surface of the imaging array 175 can result in loss of resolution; and/or 4) change in position of the scintillator 110 relative to the imaging array 175 due to shock. Since the imaging array 175 and scintillator 110 can be calibrated for pixel-by-pixel gain, a change in position can result in photosensitivity pattern noise because of the calibration no longer being accurate. Also, poor optical coupling of the light from the scintillator 110 to the imaging array 175 can result from optical index matching of the air gap (n=1) 160 formed between the scintillator 110 and the imaging array 175.

Further, changes in the optical coupling of the scintillator 110 to the imaging array 175 can occur when pressure is placed on the substrate 120 of the scintillating screen 110 resulting in localized hot spots. This pressure on the substrate 120 of the scintillator 110 can result from patient positioning. For example, an imaging procedure in which an X-ray of a foot is obtained by the patient standing on the detector array 190 can place localized pressure under the ball and heel of the foot. This exemplary localized pressure can force the scintillator 110 into closer contact with the imaging array 175, resulting in increased optical coupling. Since the gain calibration is obtained without pressure, localized loss of calibration accuracy can result.

FIG. 2 illustrates the second conventional technique to attach a scintillator to an imaging array. In FIG. 2, a layer 200 can be added over the active surface of the imaging array 175. This layer can be a planarization layer as taught, for example, in US20080099687A1 (Konica), U.S. Pat. No. 6,608,312B1 (Canon), and U.S. Pat. No. 6,770,885B2 (GE), all of which are herein incorporated by reference in their entirety. Alternatively, layer 200 can be a liquid index matching material as taught by, e.g., U.S. Pat. No. 6,469,305B2 (Hamamatsu) also herein incorporated by reference in its entirety. Such arranged layers can improve the optical coupling of the light between the scintillator 110 and the imaging array 175 and can reduce the impact of localized pressure on the scintillator 110, but the arranged layers can also introduce various disadvantages. For example, a planarization layer 200 can increase the distance between the scintillator 110 and the imaging array 175, which can result in additional lateral optical light piping and consequent loss in resolution. Further, any particulate trapped between the planarization layer 200 and the scintillator 110 can cause scratching and damage to the imaging array 175 upon shock or vibration moving the scintillator 110 with respect to the imaging array 175.

Another conventional technique is taught in JP2002055165A (herein incorporated by reference in its entirety), which teaches using an adhesive material to bond the scintillator 110 to the imaging array 175. Other conventional detector arrays have utilized spacing beads to maintain a precise separation distance between the scintillator 110 and the imaging array 175 as shown in U.S. Pat. No. 5,506,409A (Hitachi), which is also herein incorporated by reference in its entirety.

Conventional methods of mounting the scintillator 110 to the imaging array 175 do not provide sufficiently robust detector arrays 190. None of the conventional techniques discussed adequately reduce or prevent pressure, shock, and/or vibration from inadvertently moving or shifting the scintillator 110 with reference to the imaging array 175. Therefore, there is a need to provide a digital radiographic imaging array that is robust to pressure, shock or vibration by improving the attachment of the scintillator 110 with respect to the imaging array 175.

SUMMARY

Accordingly, it is an aspect of this application to address in whole or in part, at least the foregoing and other deficiencies in the related art.

It is another aspect of this application to provide in whole or in part, at least the advantages described herein.

Another aspect of the application is to provide detector imaging arrays with robust mounting of scintillating phosphor screens to imaging arrays. For example, the detector arrays can include spacers to control spacing of the scintillator from the imaging array. For example, the detector arrays can include spacers to attach the scintillator to the imaging array.

Exemplary spacers embodiments can be provided at non-active locations on an active surface of the imaging array. The spacers can form a-periodic or periodic patterns on the active surface. The spacers can be positioned at a perimeter of each pixel, including, at the corners of each pixel, along at least a portion or majority of each side of each pixel, or a continuous border around each pixel. Additional layers can be added between the scintillator and the imaging array, including planarization layers, adhesive layers, optical matching layers, protective layers, etc. Embodiments also include exemplary spacer embodiments comprising non-transparent or opaque materials that can be either absorbing or reflective. The spacers can also include colorants. Embodiments of spacers can address light (e.g., transmission, loss, etc.) at borders separating pixels.

Another aspect of the application is to provide digital radiography detector imaging arrays and methods that can provide an increase in fill factor for pixels in an imaging array.

Another aspect of the application is to provide detector imaging arrays that can provide an alternative routing for metal layers (e.g., bias line), detector imaging array that can increase a fill factor of the pixel and/or maintain low or reduce crossover capacitance between at least two metal layers (e.g., bias line and other clock, data or control lines) in the pixel.

Another aspect of the application is to provide digital radiography detector imaging arrays and methods that can enable detection of x-rays impinging on the digital radiography detector.

Another aspect of the application is to provide digital radiography detector imaging arrays and methods thereof that can automatically transition the digital radiography detector into and/or out of integration mode (e.g., imaging).

Exemplary spacers embodiments can be provided at non-active locations on an active surface of the imaging array. Exemplary spacers can include a component of the imaging array or integrated digital detector over at least one surface of the spacers.

Embodiments according to present teachings can provide a method of manufacturing a radiographic imaging apparatus that can include forming an imaging array comprising a plurality of pixels formed on a substrate, forming a plurality of spacers disposed over a first surface of the imaging array, forming a component of the radiographic imaging apparatus over a surface of the spacers, and positioning a scintillator over the components and over the plurality of spacers.

Embodiments according to present teachings can provide projection radiographic imaging apparatuses that can include a scintillator; an imaging array having a plurality of pixels formed over a substrate; and a plurality of spacers disposed between a surface of the imaging array and the scintillator to control spacing between the surface of the imaging layer and the scintillator. The spacers can reduce or prevent contact between a surface of the scintillator and the active surface of the imaging array.

Embodiments according to present teachings can provide projection radiographic imaging apparatuses including a scintillator, an imaging array comprising a plurality of pixels formed over a substrate, and spacers disposed between a surface of the imaging array and the scintillator, wherein a component of the imaging array is over at least one of the spacers.

Additional embodiments include exemplary methods of manufacturing or modifying detector arrays, including forming an imaging array comprising a plurality of pixels formed on a substrate, and forming a plurality of spacers disposed over an active surface of the imaging array, wherein the height of each spacer is greater than the height of the active surface of the imaging array. The methods further provide for attaching a scintillator to the plurality of spacers to reduce or prevent contact between a surface of the scintillator and the active surface of the imaging array.

BRIEF DESCRIPTION OF THE DRAWINGS

Various features of the embodiments can be more fully appreciated as the same become better understood with reference to the following detailed description of the embodiments when considered in connection with the accompanying figures, in which:

FIGS. 7A-7C are diagrams that show a top-down view and cross-sections of an imaging array with another embodiment of spacers, according to present teachings;

FIG. 15 is a diagram that shows a cross-sectional view of another embodiment of exemplary spacers, according to present teachings.

DESCRIPTION OF EXEMPLARY EMBODIMENTS

Figure 1:
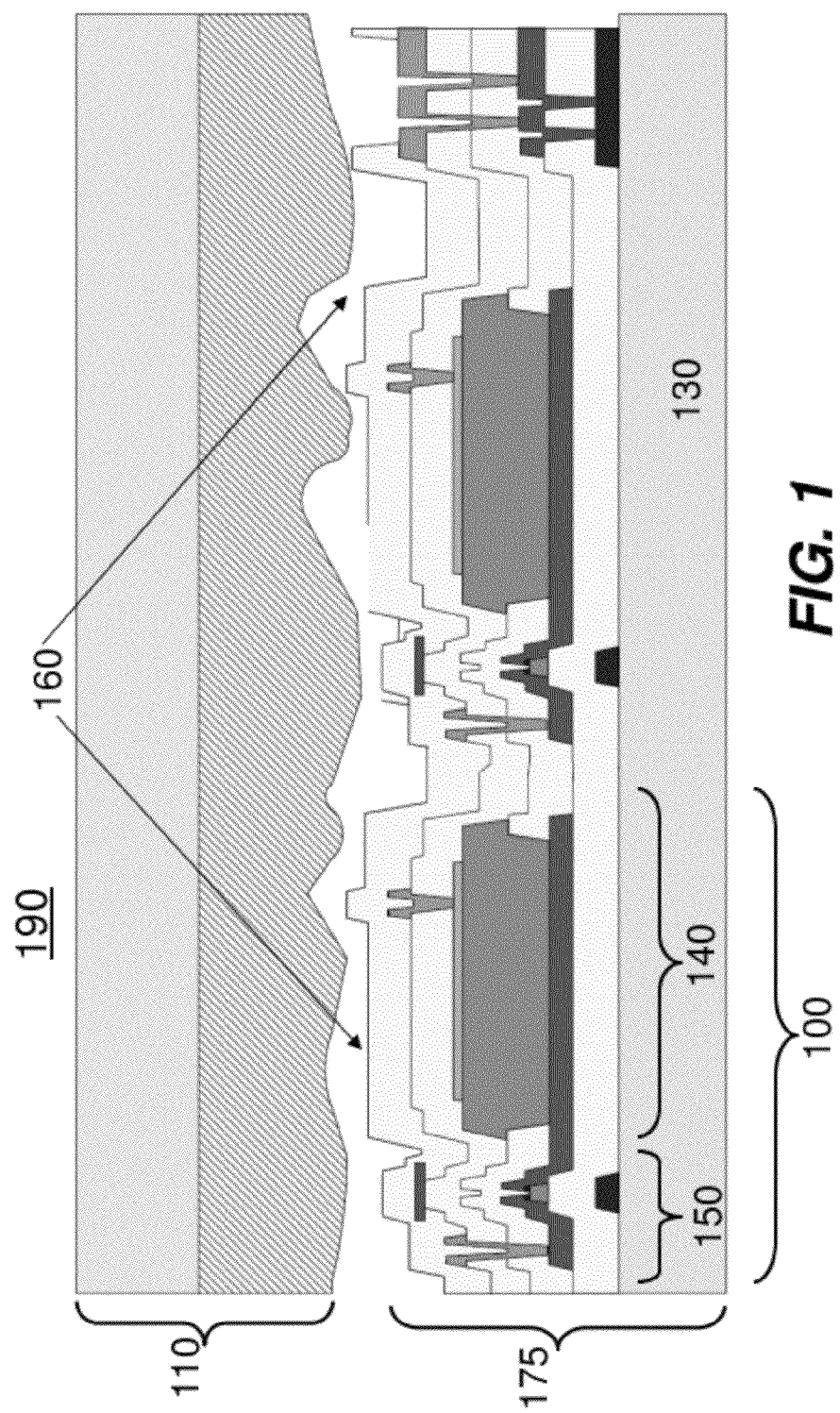
FIG. 1 shows a conventional combination of a scintillator and an imaging array.
Figure 2:
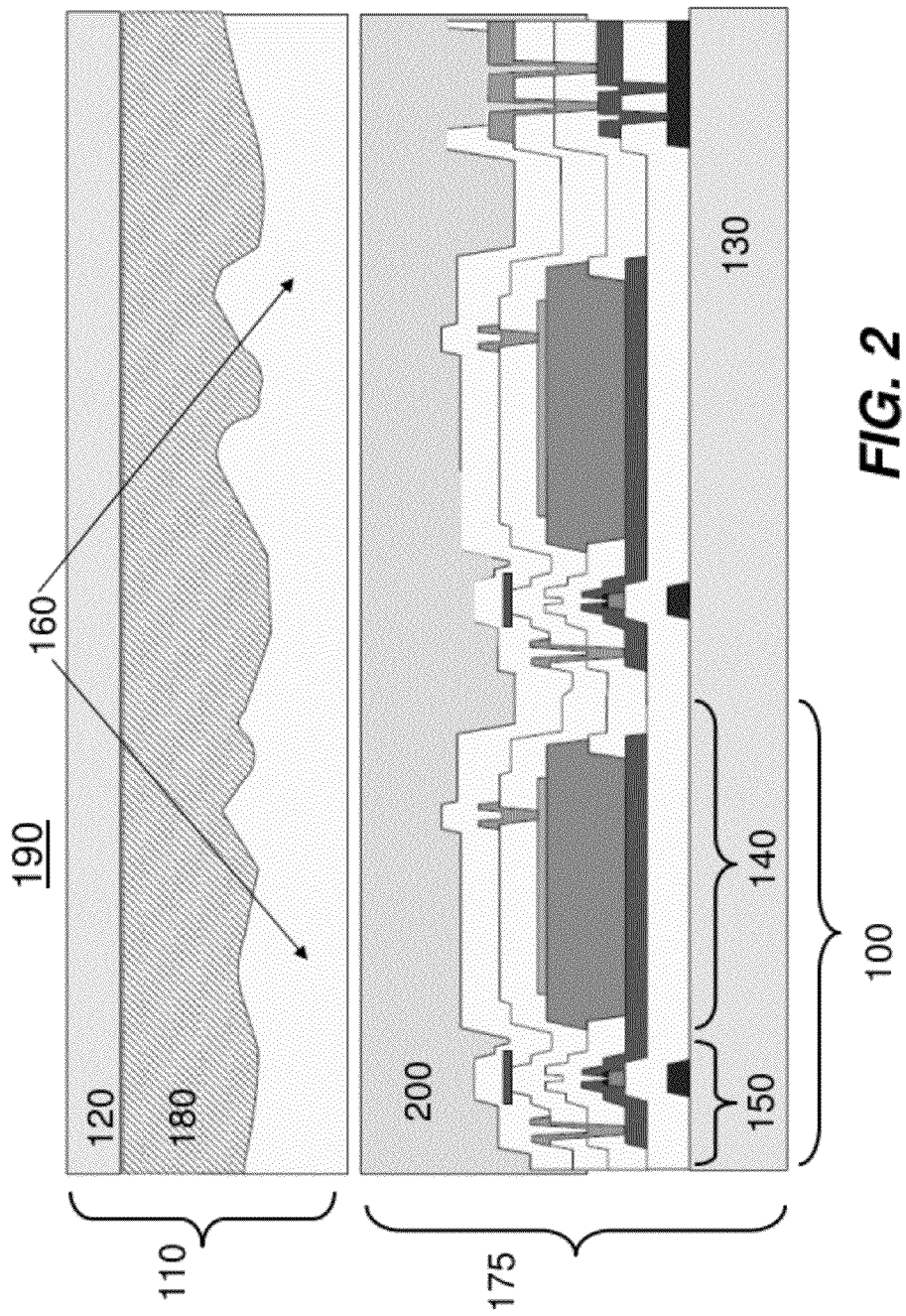
FIG. 2 shows a different conventional combination of a scintillator and an imaging array.

Reference will now be made in detail to the present embodiments (exemplary embodiments) of the invention, examples of which can be illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

For simplicity and illustrative purposes, the principles of the present invention are described by referring mainly to exemplary embodiments thereof. Moreover, in the following detailed description, references are made to the accompanying FIGS. 3-15, which illustrate specific embodiments. Electrical, mechanical, logical and structural changes can be made to the embodiments without departing from the spirit and scope of the present invention. The following detailed description is, therefore, not to be taken in a limiting sense and the scope of the present invention is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value equal to or greater than zero and a maximum value equal to or less than 10, e.g., 1 to 5. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" or "and/or" with respect to a listing of items such as, for example, "A and B" or "A and/or B", means A alone, B alone, or A and B. The term "at least one of" is used to mean one or more of the listed items can be selected.

Further, in the discussion and claims herein, the term "on" used with respect to two materials, one "on" the other, means at least some contact between the materials, while "over" means the materials are in proximity or near each other, but possibly with one or more additional intervening materials such that contact is possible but not required. Neither "on" nor "over" implies any directionality as used herein. The term between as used herein with respect to two elements means that an element C that is "between" elements A and B is spatially located in at least one direction such that A is proximate to C and C is proximate to B or vice versa. The term "conformal" describes a coating material in which angles of the underlying material are preserved by the conformal material.

Embodiments according to present teachings include radiographic detector arrays including spacers between the scintillator and the imaging array. The spacers can reduce or prevent movement between the imaging array and the scintillator. Embodiments according to present teachings can also reduce problems with optical contact between the scintillator and the imaging array, with optical coupling between the scintillator and the imaging array, with mechanical grinding between the scintillator and the imaging array, gain calibration, and optical crosstalk between pixels of the detector arrays.

Figure 3:
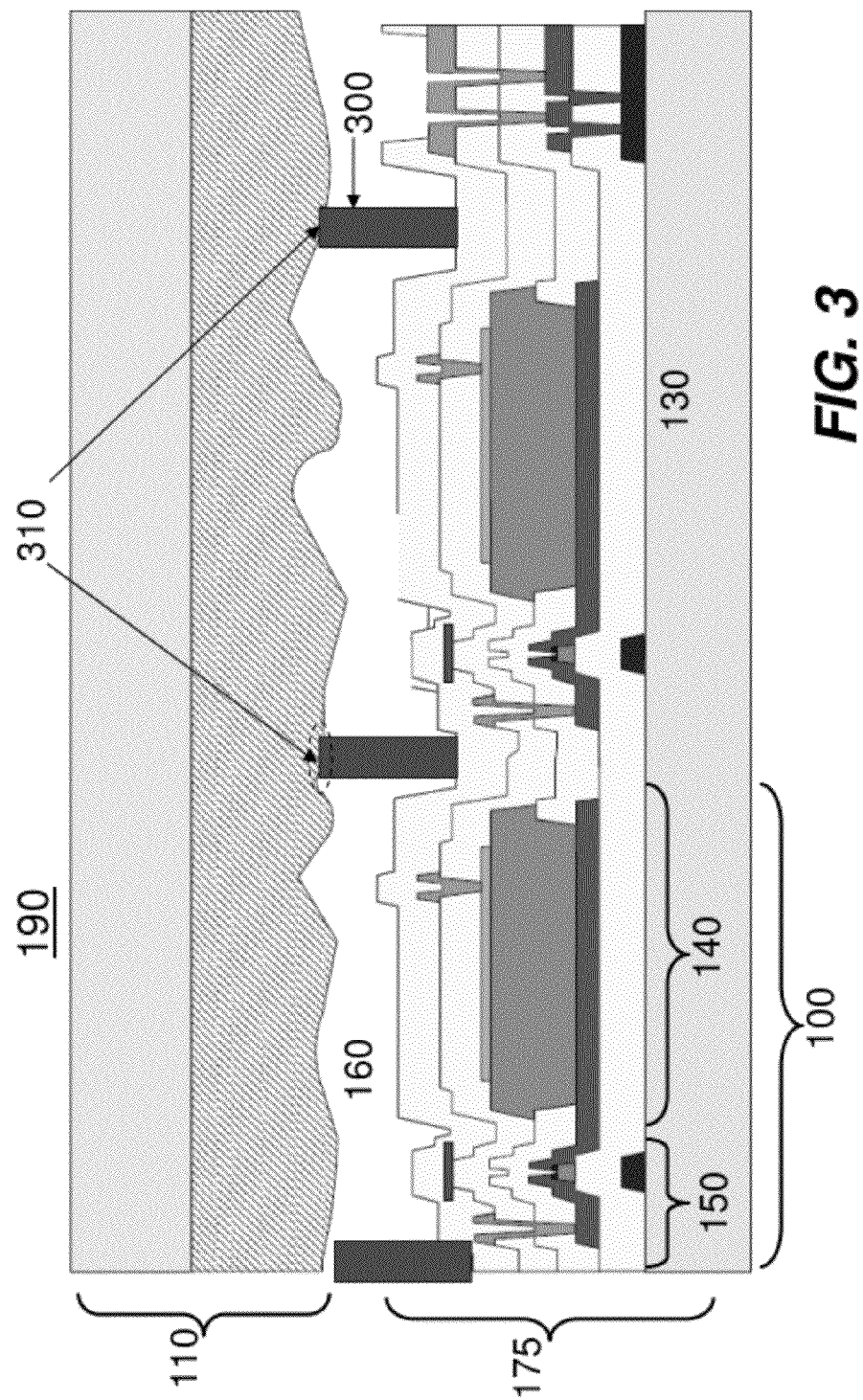
FIG. 3 is a diagram that shows a cross-section of a combined scintillator and imaging array with exemplary spacers, according to present teachings.
Figure 4:
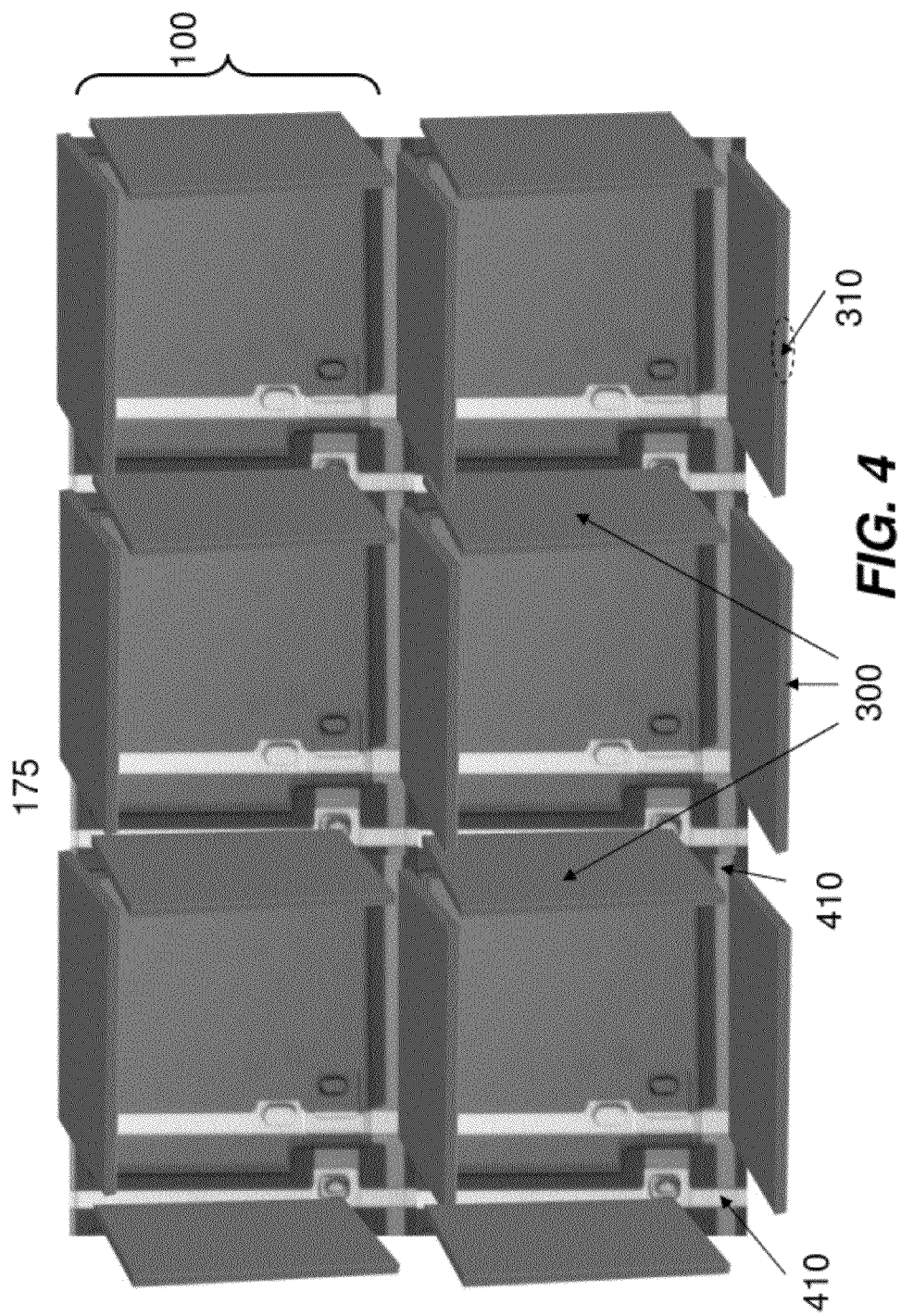
FIG. 4 is a perspective view from above of an imaging array with exemplary spacers extending along a portion of a perimeter of a plurality of pixels, according to present teachings.
Figure 5:
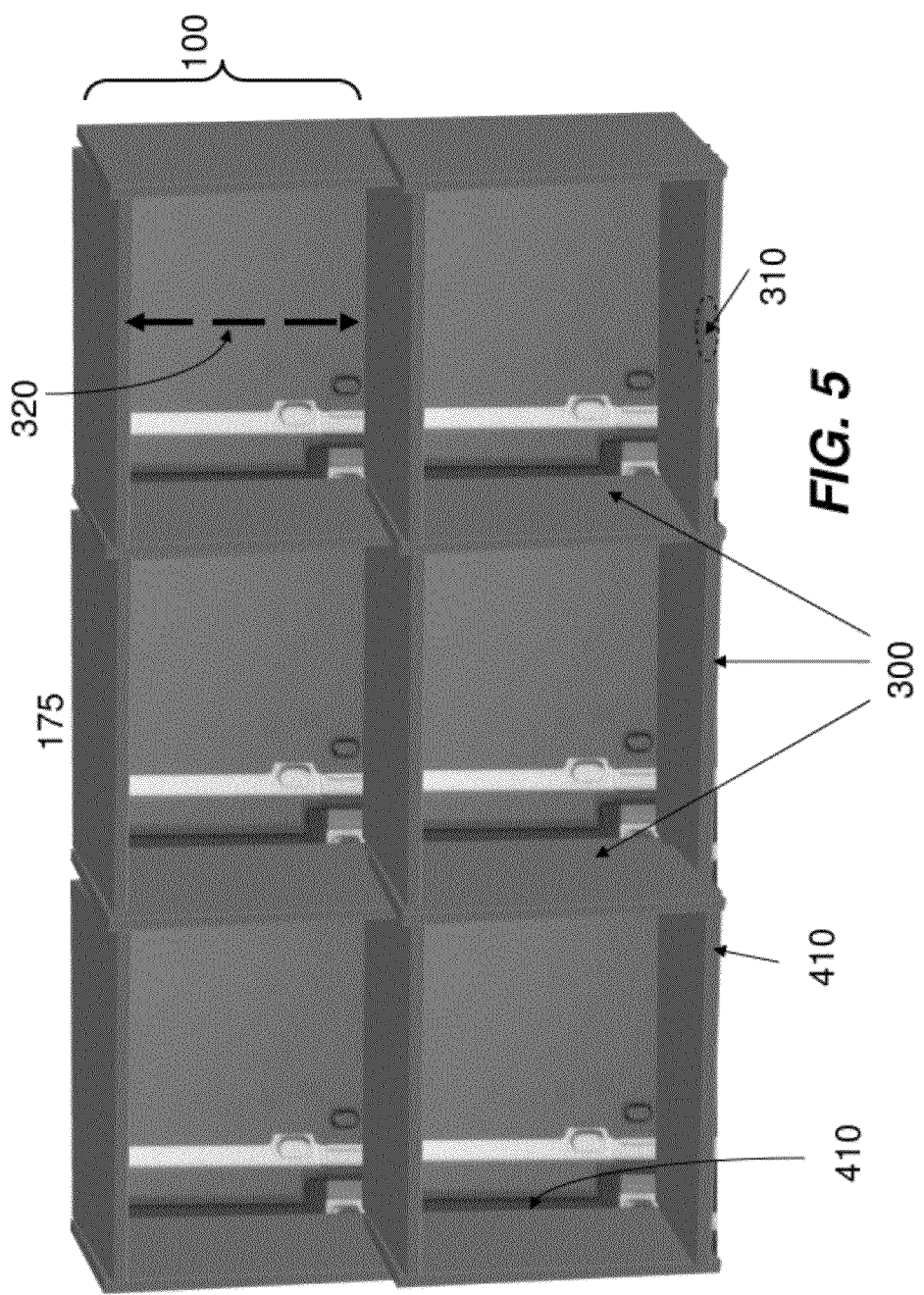
FIG. 5 is a perspective view from above of an imaging array with exemplary spacers extending along a perimeter of each pixel, according to present teachings.

Embodiments according to present teachings are shown in FIGS. 3 through 15. FIG. 3 shows an embodiment cross-section of a detector array 190 including spacers 300. FIG. 4 shows a perspective (top down) view of an imaging array 175 including spacers 300 forming walls around pixels 100. FIG. 5 also is a top down view of an imaging array 175, but includes spacers 300 forming substantially continuous borders around pixels 100.

In FIG. 3, imaging array 175 includes an array of pixels 100. As shown, pixels 100 include known photosensing elements 140 (e.g., n-i-p photodiodes, p-n junction photodiodes, MIS photosensors, phototransistors, etc.), switching elements 150 (e.g., MOS thin-film-transistors, junction field-effect-transistors, fully-depleted SOI transistors, partially-depleted SOI transistors, Silicon-on-glass transistors, bulk MOS transistors, and bi-polar transistors), read-out circuits (not shown), etc. The photosensing elements 140, the switching elements 150 and the readout circuits can be substantially co-planar. Also shown are spacers 300 that can be formed over the active surface of the imaging array 175 to provide a selected separation or fixed separation of the imaging array 175 from the scintillator 110. For example, the spacers 300 that can be formed in a regular pattern or periodic pattern over the active surface of the imaging array 175 to provide a gap between the imaging array 175 and the scintillator 110. For example, the height of spacers 300 can be higher than the active surface of imaging array 175. As used herein, the active surface of imaging array 175 is intended to include the surface of the imaging array 175 that faces the scintillator 110 and comprises pixels 100. Active areas of the active surface of the imaging array 175 can include areas used for photosensing and remaining portions of the active surface can preferable provide potential locations for the spacers 300. However, in some embodiments, the spacers 300 can be mounted on/over the active areas of the imaging array 175.

Spacers 300 can have various shapes, including, for example, prescribed shapes such as but not limited to rectangular posts, oval posts, circular posts, projections, walls of varying length, width, and thickness, (e.g., see FIG. 4), substantially continuous borders (e.g., see FIG. 5), etc., that can extend a selected amount over the imaging array 175 or descend a selected amount from the scintillator 110 (e.g., separate the imaging array 175 from the scintillator 110). In some embodiments, minimum length and width (or height) of the spacers 300 can be limited by processes (e.g., minimum feature size, critical dimensions) used to define the spacers. For photo-lithographically defined spacers, typical flat-panel process capability would require a minimum length and width of approximately 3 microns. Further, a selected or maximum width of the spacers in some exemplary embodiments can be limited by the loss of fill-factor within a detector or imaging array, and the spacers 300 can increase fill-factor losses. For example, when the spacers 300 are placed along the boundary between pixels 100, the spacers 300 width is less than the boundary width, to avoid fill-factor loss. For an exemplary 150 micron square pixel, an exemplary width of less than 10 microns would be desirable for the spacers 300. However, the spacers 300 can be formed over the active surface pixel electronics, such as interconnects, readout circuits or bias circuits, which can allow a greater width of the spacers 300. In length, the spacers 300 can range from the minimum photo-definable size up to a single pixel dimension or several pixels in length or a row-length or column-length of pixels. The selected or minimum thickness (e.g., height) of the spacers 300 should be greater than the calculated or maximum roughness of the scintillator surface opposing the active surface of the imaging array in combination with the thickness required to place the top of the spacer at a greater height than the calculated or measured imaging array topography.

For example, if the maximum or measured topography of the imaging array is 1 micron above the location at which the spacer is to be positioned and if the maximum or measured peak-to-valley flatness variation of the scintillator surface is 1 micron, a 2 micron or greater spacer thickness is desired. The selected thickness or maximum thickness of the spacers can be determined by the loss in resolution caused by lateral scattering of light (e.g., light-piping) between the active surface of the imaging array and the opposing surface of the scintillator. Thicknesses for exemplary spacers 300 can be 20 microns or less for 150 micron pixel dimension. In exemplary embodiments, thickness of the spacers 300 can be 15 microns or less, 10 microns or less, 5 microns or less, or 3 microns or less.

Further, in one embodiment, spacers 300 can be wider/larger at a lower surface (horizontal cross-section) or bottom surface than at an upper surface or top surface. For example, spacers 300 having tapered sides can improve performance characteristic and/or simplify manufacturing process. Such tapered sides can form linear or non-linear sides. Exemplary tapered spacers 300 are shown in FIG. 15.

Spacers 300 can reduce or prevent movement in all directions, including vertical, lateral and rotational directions. Spacers 300 can be formed in a periodic array along a surface of the imaging array 175, for example, between selected pixels 100 or each pixel 100. For example, the spacers 300 can be formed at one or more corners of a plurality of pixels 100, along a part of the perimeter of a plurality of pixels 100, as shown in FIG. 4, and/or as a substantially continuous border around each pixel, as shown in FIG. 5. As shown, spacers 300 can be placed in non-photosensitive regions 410 of the pixel 100. In exemplary embodiments, the non-photosensitive regions 410 can include boundaries between pixels, interconnects, readout circuits or bias circuits. For example, exemplary non-photosensitive regions 410 can be from about 3 microns wide to about 14 microns wide. For example, about a 10 micron wide border between pixels 100 that are 150 microns square can be formed.

It will be appreciated that spacers 300 can be placed at various locations around a plurality of pixels 100, selected pixels 100, each pixel 100, between some pixels 100, along edges/perimeters of pixels 100, at a single pixel 100 in the imaging array 175 and that the examples provided are not intended to be limiting. Also, it will be appreciated that the size (including length, width, and thickness) can also vary according to system requirements and the size and shape of the imaging array.

In exemplary embodiments, spacer 300 thickness or width can change or the spacer 300 density can vary throughout the imaging array. For example, the spacer 300 density can be 2×, 5×, 10× in a center region relative to an outer boundary region of the active surface of the imaging array. For example, the spacer 300 thickness can be 1.5×, or 2× in a center region relative to an outer boundary region of the active surface of the imaging array. Further, a transition between the center region and the boundary region can be gradual or tiered. An exemplary gradual transition can be linear or nonlinear increase toward the center region.

According to exemplary embodiments, an adhesive layer (not shown) can be added to a surface 310 of the spacers 300 to form a bond to the surface of the scintillator layer 110 facing the spacers 300 to reduce or prevent lateral movement of the scintillator 110 with respect to the imaging array 175. Alternatively or in addition, a passivation layer (not shown) can be included on the active surface of the imaging array 175, and the spacers 300 can be formed over or extend through the passivation layer (not shown) to meet the surface of the scintillator 110.

In embodiments, spacers 300 can extend from the active surface of imaging array 175 through gap 160 to the surface of the scintillator 110 facing the active surface of the imaging array 175. Cavities 320 can be formed between the spacers 300 when one or more spacers 300 form a partial border or continuous border around the perimeters of pixels 100 as shown in FIG. 4 or 5 (no scintillator shown). When cavities 320 are present (e.g., when spacers 300 include continuous borders around each pixel 100), an optical index matching material can be filled in the cavities, e.g., by a fluid wicking method, etc., to improve the poor optical coupling of light from the scintillator 110 to the imaging array 175 resulting from optical index matching of the air gap (n=1) 160 between the scintillator 110 and the active surface of the imaging array 175. In one embodiment, whenever spacers 300 are used to define a spacing between the imaging array 175 and the scintillator 110, the optical index matching material can be used to fill the gap 160. In another embodiment, the optical index matching material can be used to fill the gap 160 above a planarization layer partially covering the spacers 300.

Embodiments of radiographic detector arrays 190 using spacers 300 can reduce problems with non-uniform optical contact between the scintillator 110 and the photosensing elements 140 in the imaging array 175, which can result in non-uniformities in sensitivity to X-rays from pixel 100 to pixel 100. Embodiments of radiographic detector arrays 190 using spacers 300 can reduce or remove direct contact between the scintillator 110 and the imaging array 175. Embodiments of radiographic detector arrays 190 using spacers 300 can reduce localized hot spots. Therefore, the optical coupling between the imaging array 175 and the scintillator 110 can be more consistent or substantially the same for all pixels 100 in the imaging array 175. Embodiments can also improve problems with mechanical grinding, shock, vibration, differences in coefficients of thermal expansion, etc., between the scintillator 110 and the imaging array 175, which can result in damage to one or both when the scintillator 110 moves with respect to the imaging array 175. Embodiments of radiographic detector arrays 190 using spacers 300 can stabilize the scintillator 110 with reference to the imaging array 175. The stabilization resulting from the use of spacers 300 can also reduce gain calibration errors caused by shock and problems with optical coupling resulting in localized hot spots caused by pressure on the scintillator 110. By stabilizing the scintillator 110 in relation to the imaging array 175, pressure, shock, vibration, differences in coefficients of thermal expansion, etc., applied to the radiographic digital detector array 190 can be absorbed or dissipated while reducing or eliminating the scintillator 110 or imaging array 175 movement or relative movement.

Additional embodiments can include forming the spacers 300 from opaque materials. Opaque as used herein can include materials that absorb light or reflect light. Absorbing opaque materials can have an exemplary absorption of equal to or greater than about 60%, 80%, or 90% in an exemplary 3-10 micron thickness of spacers 300. Reflecting opaque materials should have a transmission of less than 40%, 20% or 10% in the 3-10 micron thickness of spacers 300. Colorants, as used herein can include, dyes, pigments, etc., that can be incorporated into spacers 300 to make the spacers 300 opaque. The spacers 300 can include opaque materials or at least one surface of the spacers 300 can include opaque materials. For example, dye or pigment may be diffused into or transferred onto the surfaces (e.g., side surfaces or a top surface) of the spacers, such as by techniques used to form color filter arrays for displays.

Absorbing materials (e.g., colorants, etc.) for the spacers 300 can be used reduce optical crosstalk caused by light piping between the imaging array 175 and the scintillator 110. For example, if spacers 300 extend along the perimeter of each pixel 100 (as shown in FIGS. 4 and 5), a material forming the spacers 300 can be opaque and/or comprise a colorant that can reduce optical transmission. Spacers 300 can absorb light that otherwise could be detected in adjacent pixels 100. Alternatively, spacers 300 can reflect light to remain detectable by a corresponding pixel 100. Reflective spacers 300 can reflect light to reduce crosstalk between pixels 100. In one embodiment, only one surface (e.g., a top surface) of the spacers 300 can be absorptive or reflective (e.g., both side surfaces).

It will be appreciated that incorporation of colorants in photo-patternable materials can block the UV wavelengths used for photolithography and therefore the colorants that are substantially transparent to UV but opaque in the visible spectrum can be used. Use of bleaching dyes which become transparent at high exposures or UV exposure can also be an alternative for photo-patternable materials. Alternatively, an opaque spacer material may be patterned using photoresist and the pattern in the photoresist transferred to the spacer material by subsequent wet etching or dry etching of the underlying spacer material.

While reducing or preventing crosstalk, the dyes or colorants also can reduce the signal level because of the optical absorption of the light emitted from the scintillator 110 under the spacers 300. Some of this light can be reflected back into the scintillator 110 from the metal gatelines and datalines and later detected. Lateral scattering of light caused by reflections off the active surface of the imaging array 175 and the scintillator 110 can result in loss of resolution can be improved by using absorbing spacers 300. To further improve the overall efficiency of the radiographic digital detector 190, a wicked-in optical coupling material, as described further below, can also be incorporated.

In further embodiments, reflective spacers 300 can be used to address the loss of light in the spacers 300 separating each pixel 100. The reflecting material can display specular reflection or diffuse reflection. In specular reflection, the angle of incidence equals the angle of reflection, while in diffuse reflection, the resulting reflection can be distributed over a range of angles. High reflectivity can be obtained by using metals such as, aluminum, nickel, chromium, silver, etc. Because the light is not reflected multiple times, wall reflectivity greater than or equal to about 80% can be used. High reflectivity can also be obtained by creating stacks of dielectrics (e.g., interference filters) or using diffuse reflectors, e.g., $TiO_2$ particles.

Embodiments of detector arrays 190 including spacers 300 can be manufactured in many ways, the embodiments discussed below are various example methods, but are not intended to be limiting. For purposes of this disclosure, exemplary method embodiments will include manufacturing spacers 300. As discussed previously, detector arrays and the methods of manufacturing detector arrays are generally known.

Embodiments provide methods of manufacturing spacers 300. In embodiments, a photo-patternable polymer layer can be coated by spin or spray coating on the imaging array 175 and pre-baked to prepare the layer for photolithography. Examples of photo-patternable polymers include, e.g., photosensitized polyimides, photosensitized BCB, photoresist, etc. Alternatively, a non-photo patternable organic or inorganic material can be deposited or coated on the imaging array 175 followed by a photoresist coating. The photoresist can be patterned and the pattern transferred to the underlying organic or inorganic layer by etching, for example, ion beam milling, reactive ion etching (RIE), etc. The resist can then be removed, leaving spacers 300. It will be appreciated that photolithography techniques, anisotropic etching techniques, isotropic etching techniques, various deposition techniques, etc. are well known in the art and the techniques can be adjusted as required to obtain desired results herein.

In cases in which the coefficient of thermal expansion (CTE) of the scintillator material is different from the CTE of the imaging array, disadvantages described above including damage can be caused as temperature change moves the scintillator 110 relative to the imaging array 175. When the CTE of the scintillator material is different from the CTE of the imaging array, it is desirable for the spacers 300 to deform laterally to reduce stress between the imaging array 175 and the scintillator 110 caused by differential thermal expansion. In exemplary embodiments, the spacers 300 can be formed using a material with a low Young's modulus as compared to the scintillator material and/or the imaging array, so that the spacers 300 may deform laterally to reduce stress between the imaging array and the scintillator caused by differential thermal expansion. Examples of spacer materials with low Young's modulus include RTV. Exemplary spacers 300 can have anisotropic deformation where vertical deformation is less than lateral deformation (e.g., relative to the active surface), lateral deformation is 2×, 5× or 10× the vertical deformation, or vertical deformation is small or minimal. In one embodiment, the vertical deformation is minimal and lateral deformation is designed to counter or sufficient to counter differential CTE effects between scintillator materials and the imaging array. In one embodiment, spacers 300 can comprise partially horizontally (or slanted, vertically) extending materials or inserts (e.g., composite materials) to reduce vertical deformation while maintaining lateral deformation. Embodiments of inserts can extend from a bottom surface of the spacers 300 up to 50%, 75% or 90% of the height of the spacers 300. An exemplary embodiment of inserts 1510 for spacer 300 is shown in FIG. 15.

As discussed above, an adhesive material can be applied between the scintillator 110 and the spacers 300 (e.g., to the surface 310). The adhesive material can be applied by various methods, including, for example, applying photo-patternable adhesives to the surface of the spacers 300 facing the scintillator 110 and patterning both the adhesive and the spacers 300, or coating adhesive material on a surface of the scintillator 110 facing the spacers 300 and bonding the scintillator 110 to the spacers 300 by applying, e.g., pressure, heat, chemical processes, combinations thereof, etc. For example, pressure sensitive adhesives can by applied to the surface 310 and attach the spacers 300 to the scintillator 300 by pressure.

Alternatively, the spacers 300 can be heated to soften the spacers 300 during bonding to allow attachment to the scintillator 110. In one embodiment, the scintillator 110 can be heated during attachment to the spacers 300 causing a binder on a top surface to attach the surface 310 of the spacers 300. In one embodiment, the spacers 300 can have a lower melting temperature than the scintillator 110 or the imaging array 175, and the spacers 300 can be heated to a softened, tacky state for attachment to the scintillator 110

Examples of optically clear adhesives include adhesive 8141 manufactured by 3M™, St. Paul, Minn., which is pressure sensitive adhesive with a thickness of 25.4 um, a refractive index of 1.4742 at 633 nm, a haze level of 0.1%, and a light transmission greater than 99% over the visible spectrum. Gel-Film PF-40/1.5-X0 by Gel-Pak™ Hayward, Calif. is made from cross-linked polymer material. The material adheres to a surface on contact based on surface tension. These adhesives are transparent and come with different sizes and thickness. Typical refractive index is in the range of 1.46 and 1.60. Other pressure sensitive adhesives can be formulated with one or more monomer containing a substituted (or an un-substituted) aromatic moiety to provide a thickness of 12.7 um, a refractive index of 1.48-1.56, a light transmission of greater than 92%, and a good adhesion strength.

As discussed above, index matching material can be used in cavities 320 or in the space defined by the spacers 300 between the imaging array 1785 and the scintillator 110 to improve optical coupling between the scintillator 110 and the imaging array 175. For a scintillator screen having a first index of refraction $n1$, an imaging array having a light accepting surface from a material with index of refraction $n2$ and an optical coupling material having an index $n3$, selected or optimal optical coupling occurs when $n3$ is equal to the square root of $n1$ times $n2$. To provide optical coupling with improved optical efficiency, it is desirable to eliminate or at least significantly decrease the amount of internal reflection that occurs at the interface between scintillator 180 and an optical matching material. As long as the index of refraction $n1$ is equal to or less than the index of refraction $n3$ of the optical matching material, there is little/no loss of light caused by internal reflection; only refraction occurs. As long as the index of refraction $n3$ is equal to or less than the index of refraction $n2$ of the imaging array, there is no loss of light due to internal reflection; only refraction occurs.

For example, consider scintillator screen 180 having an overcoat layer (70 wt. % PMMA+30 wt. % PVDF) with a refractive index of 1.47 at the wavelength of 0.55 um, coupled to imaging array 175 having passivation layer 42 ($SiO_xN_y$) with a refractive index of 1.89 at the wavelength of 0.55 um. The coupling is achieved using an optical matching material layer with a refractive index $n3$. The dependence of optical coupling efficiency on the refractive index of the optical matching material layer for scintillator screens (e.g., $Gd_2O_2S$ and CsI screens) can increase from $n3=n1$ to a peak at $n3$ equal to the square root of $n1$ times $n2$, then decreases with further $n3$ value increase up to $n3=n2$.

For this example, $n3$ equal to the square root of $n1$ times $n2$ is an index of refraction of 1.67. Below a value $n3$ of 1.47 (equal to the value of $n1$), efficiency drops off steadily. For example, with value $n3$ at 1.44, efficiency drops by about 5%. With value $n3$ at 1.40, efficiency drops by about 10%. With value $n3$ at 1.37, efficiency drops by about 15%. The same general behavior occurs, with incrementally decreasing efficiency, as value $n3$ exceeds 1.89, the value of $n2$ in this example. The selection of an optical matching material with a refractive index in the range from about 1.44-1.56 at the wavelength of 0.55 um provides optical coupling efficiency within the highest range for this example.

In practice, it can be very difficult to obtain the exact same index of refraction from two different materials, even where formulation adjustments are possible. To "substantially match" a refractive index, as the phrase is used in the context of the present disclosure, means that two indices differ from each other by no more than about 0.12, more preferably by no more than about 0.08 and most preferably by no more than about 0.04. With a difference in indices of about 0.12, optical coupling efficiency is reduced by about 15% or less. With a difference of about 0.08, optical coupling efficiency is reduced by about 10% or less. With a difference of about 0.04, optical coupling efficiency is reduced by about 5% or less.

Embodiments including an index matching material can include a method of wicking an index matching fluid into gap 160 between the scintillator 110 and the imaging array 175. As shown in FIGS. 3-5, the spacers 300 can control a separation between the imaging array 175 and the scintillator 110 (e.g., cavities 320). An edge seal with a small opening (not shown) can be formed (e.g., between the display backplane glass and the counter-electrode glass), air can be evacuated from the gap 160 or the cavities 320, and, for example, a fluid optical index matching material can be wicked into the small opening, filling the gap 160 or cavities 320 (e.g., between the backplane and the counter-electrode glass). Optionally, the fluid optical index matching material can be gelled or solidified by heat or optical illumination after wicking.

To form spacers 300 including colorant, organic or inorganic materials can be used, similar to the above methods. For example, photo-patternable organics can be used by coating a photo-patternable organic material (e.g., photo-sensitized BCB, polyimide, acrylic, etc.) containing colorant on the imaging array 175. The photo-patternable organic coating can then be exposed to a photomask pattern aligned to the pixels 100 and developed using a developer. Alternatively, a non-photo-patternable organic can be coated on the imaging array 175 with a thin inorganic hard mask (e.g., about 100 nm of silicon dioxide). The inorganic hard mask can be patterned using photolithography and the pattern transferred to the organic non-photo-patternable coating using anisotropic dry etching (e.g., RIE or ion milling).

In additional embodiments, inorganic materials (e.g., metal silicides, carbon, etc.) can be vacuum deposited in a layer or a sequence of layers to form spacers 300. The deposited layers can be patterned by photolithography techniques and then etched using anisotropic dry etch (e.g., RIE or ion milling). Alternatively, a spin-on process can be used. For example, an inorganic precursor (e.g., sol-gel or organo-silicate) can be spun on the imaging array 175. If the precursor is transparent, a colorant can be added to the spun on coating to make the precursor substantially opaque to light emitted by scintillator 110. The precursor can then be cured to form a substantially inorganic film, the film can be patterned using photolithography techniques and etched as described above using, e.g., anisotropic dry etch.

In other embodiments, dyes can be used as discussed above. Dyes can be diffused into patterned spacers 300 or unpatterned receiving materials. If the spacers 300 are previously patterned, then the spacer 300 material can be, e.g., a photo-patternable layer as discussed above that can also be a dye-receiving material. Following patterning, dye can be diffused (e.g., thermally) into the photo-patternable dye-receiving material. If the spacers 300 include unpatterned receiving materials, a dye-receiving material can be coated on the imaging array 175. The dye-receiving material can, for example, contain mordants to bind dye molecules. U.S. Pat. No. 4,876, 167 teaches uses of mordants to bind dye molecules in organic color filter arrays. Image-wise transfer methods can be used to transfer dye from a dye donor material into the dye-receiving material using, for example, laser dye transfer techniques, or resistive head thermal dye transfer techniques, or patterning a barrier layer coated on the dye-receiving material followed by dye diffusion.

Embodiments according to present teachings also include reflective spacers 300, as discussed above. To manufacture reflective spacers 300 the following methods can be used. A vacuum deposited metal layer can be photolithographically patterned to substantially surround either the organic or inorganic spacers 300 discussed above. Alternatively, plated metal spacers can be formed by patterning a seed layer of metal to substantially surround each pixel 100 and plating the spacers 300 from the seed layer by metal plating. Other embodiments can include forming a diffuse reflecting material through deposition (e.g., spin-coating, vacuum deposition, spray coating, etc.) and patterning (e.g., by shadow-masking or photolithography) to substantially surround each spacer 300. Additional embodiments can include lamination. For example, a reflective material layer can be transferred by lamination onto the imaging array 175 and patterned (e.g., as part of the lamination process through laser transfer, following lamination using photolithography, or prior to lamination through the use of a donor sheet).

As will be obvious to one of ordinary skill in the art, the various embodiments can be combined to form many different combinations, all of which are intended to be incorporated by this disclosure. For example, following fabrication of the reflective spacers 300, deposition of a thin organic or inorganic encapsulating layer can be performed. This can serve to protect the reflective spacers 300 and prevent oxidation; adhesive attachment to the scintillator 110 can be performed; planarization of the scintillator 110 material prior to attachment to the spacers 300 on the imaging array 175 can be performed, and/or wicking in optical matching material can be performed.

Figure 6:
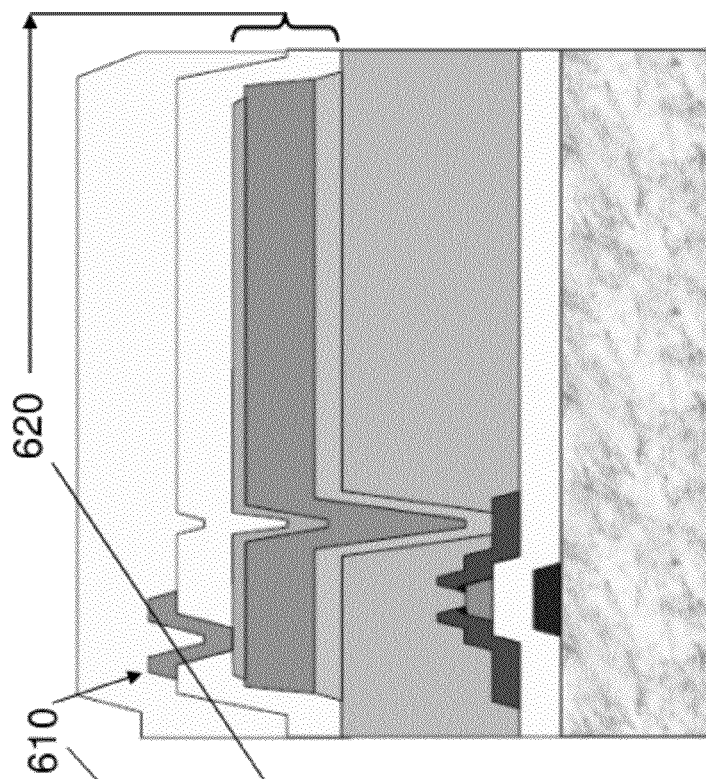
FIG. 6 is a diagram that shows a related art pixel using a bias line to provide a contact to a top of a photosensor.
Figure 6:
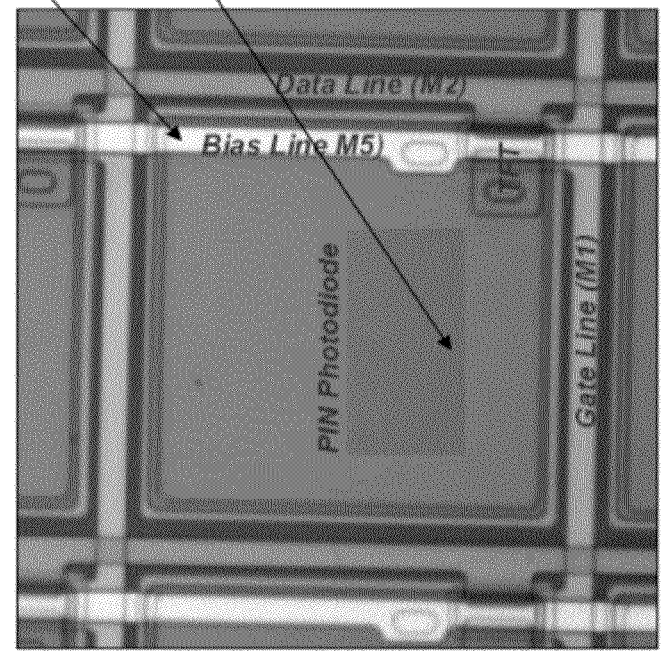

One disadvantage of related art backplanes for digital radiography is that the need for a bias line overlying the photosensor can cause a loss in fill factor. Fill factor of a digital X-ray detector can be a percentage of the surface area that is active (e.g., capable of detecting photons). The higher the fill factor the more sensitive the digital X-ray detector. FIG. 6 is a diagram that shows a related art pixel using a bias line to provide a contact to a top of a photosensor. As shown in FIG. 6, a top view and a cross-sectional view of a related art pixel 600 including an exemplary bias line 610. The bias line 610 can be a conductor fabricated in a metal or the like. For example, the bias line 610 can be fabricated in a metal such as aluminum, which is opaque to light. As shown in FIG. 6, the pixel 600 can have a square shape, and the fill factor of a pixel can be approximately 60-66%. As shown in FIG. 6, the bias line 610 is approximately 8 microns wide, although; the bias line 610 can be wider or narrower. Further, it is possible to route the bias line 610, which can be in the fifth layer/level of metal, over the top of the data line, which can be in the second layer of metal, the added capacitive loading on the data line would result in greatly increased noise. The signal-to-noise ratio of the pixel array shown in FIG. 6 is increased or optimized when the bias line 610 is over a photosensor (e.g., photodiode 620) rather than on top of/over a data line or lower metal layer.

Figure 7D:
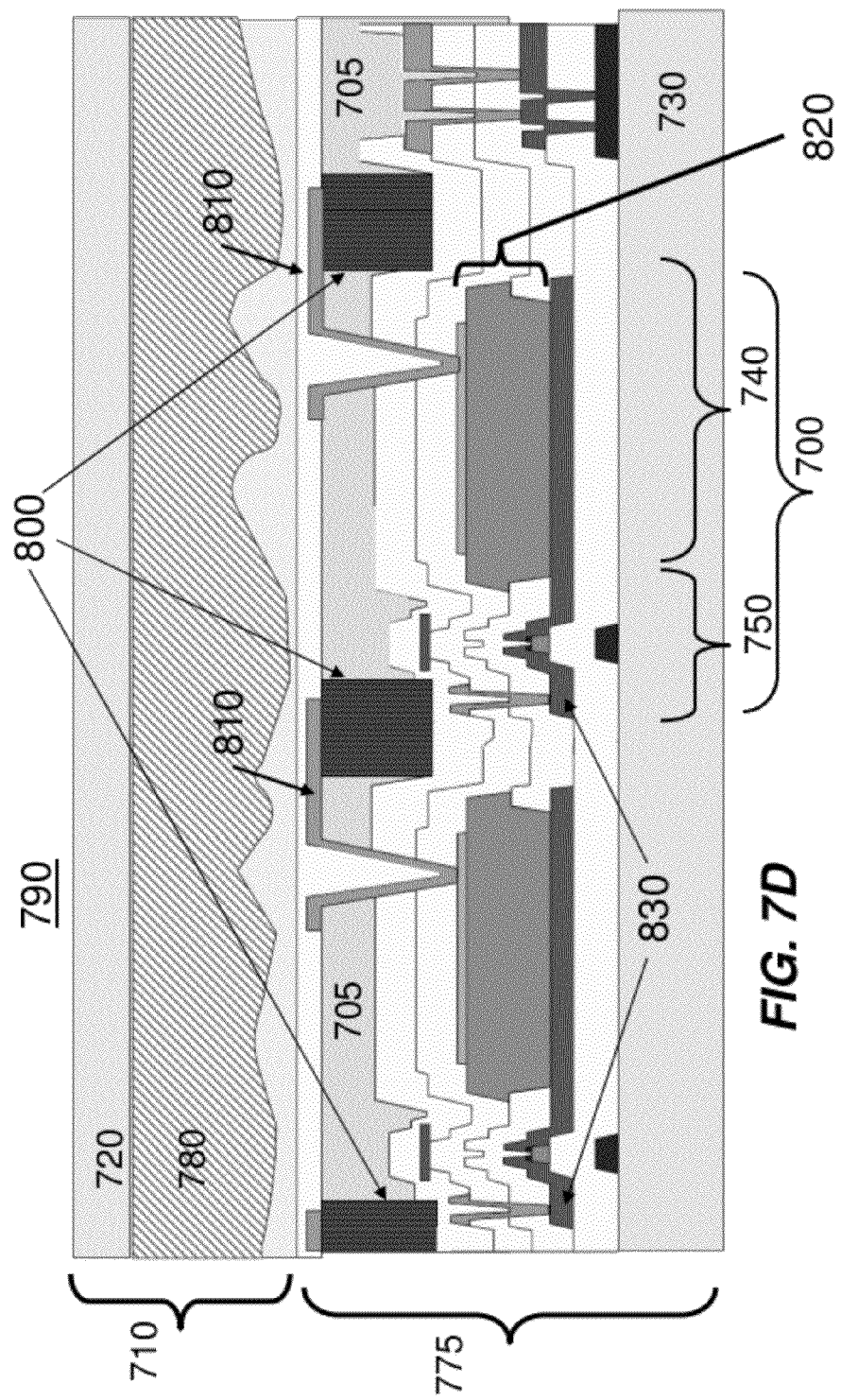
FIG. 7D is a diagram that shows a cross-section of a combined scintillator and imaging array with an embodiment of spacers shown in FIGS. 7A-7C.

FIGS. 7A-7C are diagrams that show an imaging array and cross-sections of an imaging array with another embodiment of spacers, according to present teachings. An imaging array and spacers shown in FIG. 7A-7C can be used for a combined scintillator and imaging array in a projection radiographic imaging apparatus or digital radiography detector as shown in FIG. 7D. Active areas of the active surface of the imaging array shown in FIG. 7A can include areas used for photosensing and remaining portions of the active surface can preferable provide potential locations for the spacers 800. As shown in FIG. 7A-7D, the spacers 800 can be on or over a pixel perimeter (e.g., partially) and can include a conductor (e.g., bias line, trace or metal) routed on a surface (e.g., a top surface) of the spacers 800. The conductor on/over the spacers 800 in FIG. 7D can provide an alternative routing for connections inside the imaging array 775 such as a bias line 810 that can increase a fill factor of the pixel and/or reduce a crossover capacitance between the bias line 810 and other clock lines or signal lines (e.g., data lines) in an imaging array or pixel. Further, the bias line 810 can be formed with improved characteristics (e.g., decreased resistance) by increasing a size or thickness relative to the bias line 610.

As shown in FIG. 7D, an imaging array 775 can include switching elements 750 and photosensing elements 740 in pixels 700 and scintillator 710 can include scintillating screen 780 formed on a substrate 720, as known in the art. Imaging array 775 can be formed on a substrate 730 (e.g., glass). Scintillator 710 can be placed over spacers 800 and the imaging array 775 to form an integrated digital detector 790. Exemplary embodiments of spacers 800 can address various effects of a gap 760 that can form between scintillator 710 and an active surface of imaging array 775. The active surface of imaging array 775 can display topography between the highest and lowest point of about 1-5 µm. In addition, the surface of the scintillator 710 facing the active surface of the imaging array 775 can often display surface roughness on the order of several microns. An optional planarization layer 705 in FIG. 7D can be used with the active surface of the imaging array 775.

In exemplary embodiments, at the spacers 800, a component of the imaging array 775 or digital detector 790 can be defined that can be coupled to one or more terminals within a pixel 750. For example, the component of the imaging array 775 or digital detector 790 can be on or over the spacers 800, formed in or partially inside the spacers 800, or integrated with or integral to the spacers 800.

In an exemplary embodiment shown in FIGS. 7A-7D, a conductor on a top surface of the spacers 800 can be a bias line 810 that can be connected to the top terminal of the photosensor (e.g., PIN photodiode 820). The bias line 810 on the spacers 800 can be over the data line 830. As shown in the top view of FIG. 7A, this exemplary embodiment can increase fill factor for the imaging array 775. For example, the fill factor in FIG. 7A is increased about 3-5% relative to the fill factor of the pixel 600 shown in FIG. 6.

In exemplary embodiments, the spacers 800 can include spacers 300 as described herein, (e.g., absorptive spacers or reflective spacers described with respect to FIGS. 3-5).

Thus, various exemplary methods can be used to manufacture the spacers 800 such as the structure shown in FIG. 7D. For example, opaque spacers 800 (e.g., spacers 300) can be patterned according to one of the methods described above. Further, reflective spacers 800 (e.g., spacers 300) can be manufactured according to one of the methods described above. Alternatively, absorptive spacers 800 (e.g., spacers 300) can be manufactured with a metal trace patterned thereon according to one of the methods described above.

Figure 8:
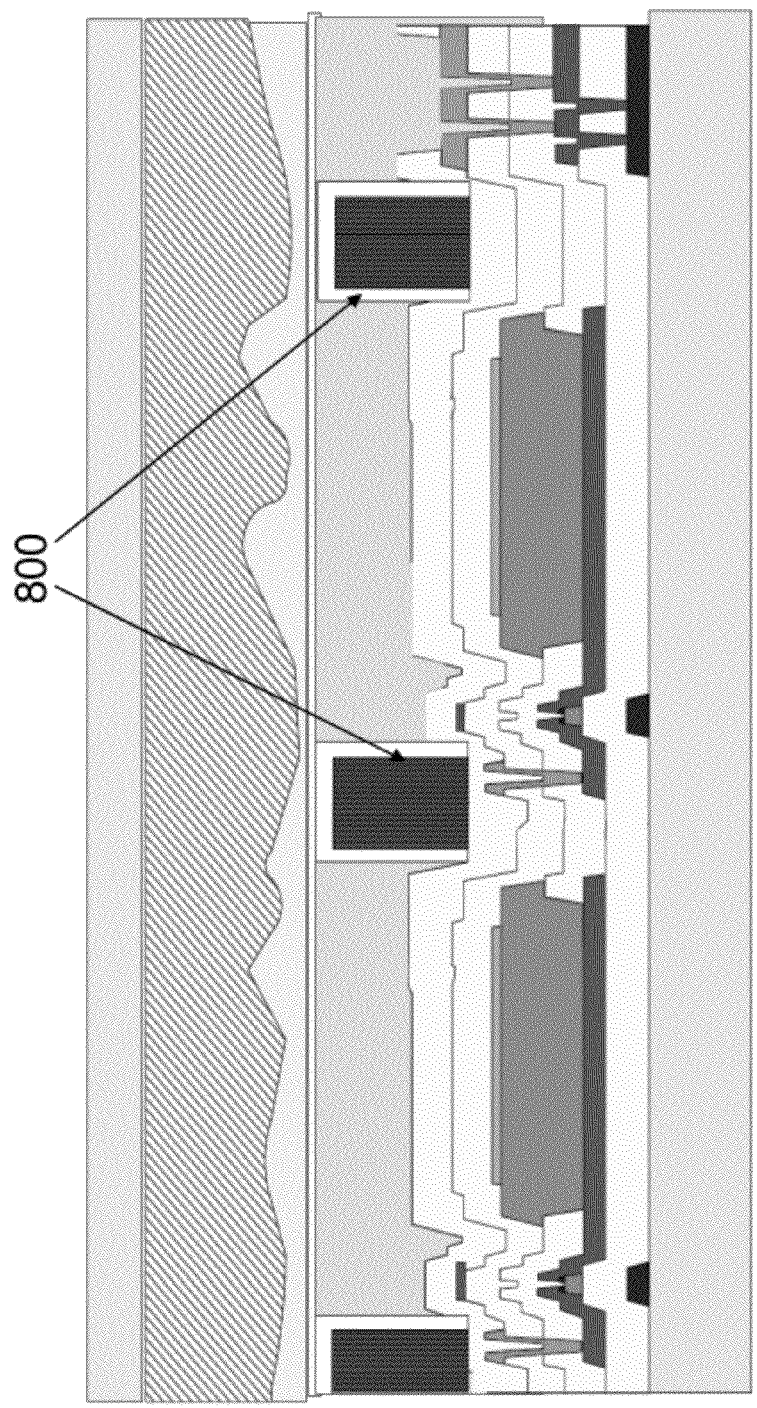
FIG. 8 is a diagram that shows a cross-sectional view of a combined scintillator and imaging array with exemplary spacers with metal traces surrounding the spacers to provide a reflective surface extending along a pixel perimeter, according to present teachings.
Figure 9:
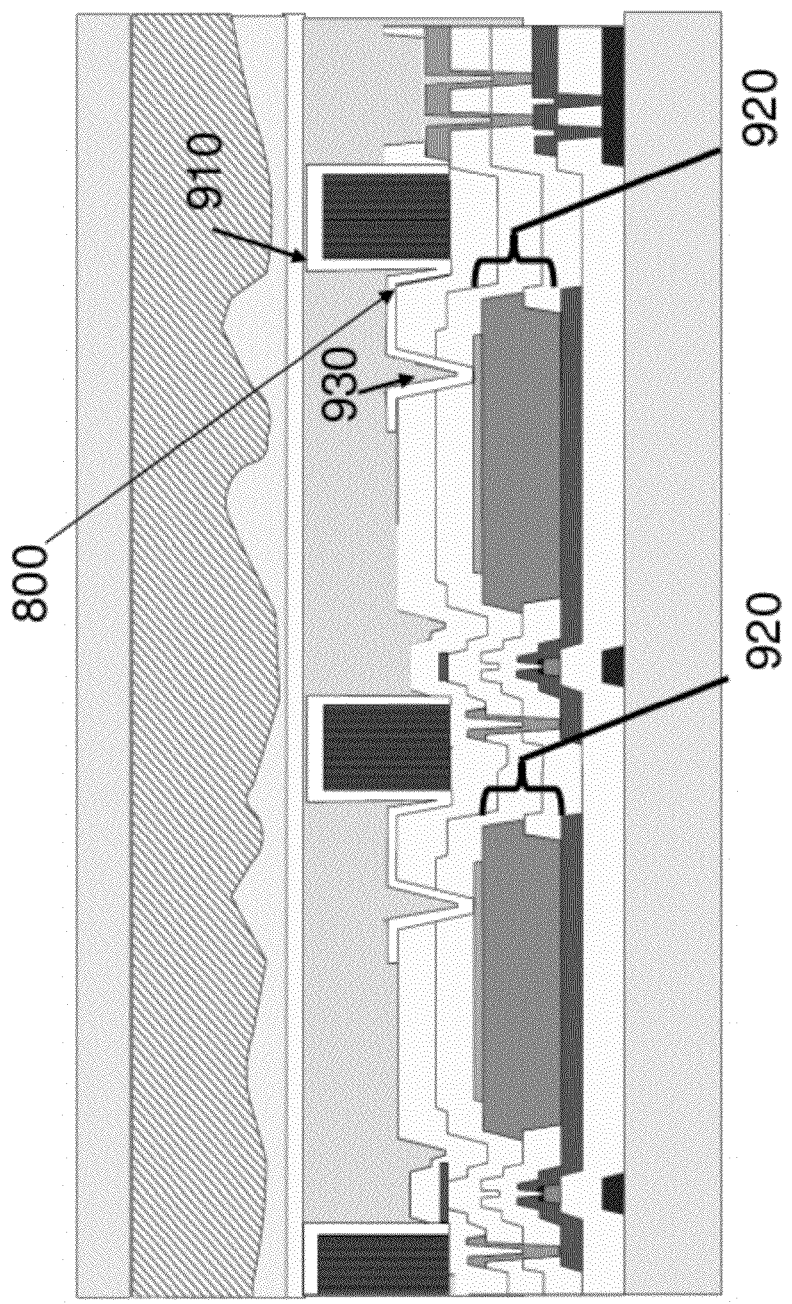
FIG. 9 is a diagram that shows a cross-sectional view of a combined scintillator and imaging array with exemplary spacers with reflective metal traces surrounding the spacers and routing of conductive reflective metal traces to extend toward a contact region, according to present teaching.

Additional embodiments of the spacers 800 can use both reflective configurations/conductive materials and routing of conductive traces. Exemplary reflective spacers 800 and routing of conductive traces are illustrated in FIG. 8 and FIG. 9. As shown in FIGS. 8-9, a reflective material, such as aluminum, can be used to form the conductive trace(s) and the traces extend over the sides of the spacers 800, making the spacers 800 light reflecting. Further, the reflective conductive material can extend from the spacers 800 into the pixels 700 or the imaging array 775 to connect to components thereof. Exemplary reflective spacers 800 and routing of conductive traces illustrated in FIG. 9 show a reflective bias line 910 coupled through vias 930 to PIN photodiode 920. Again, the fill factor in FIG. 9 is increased relative to the fill factor shown in FIG. 6.

Figure 10:
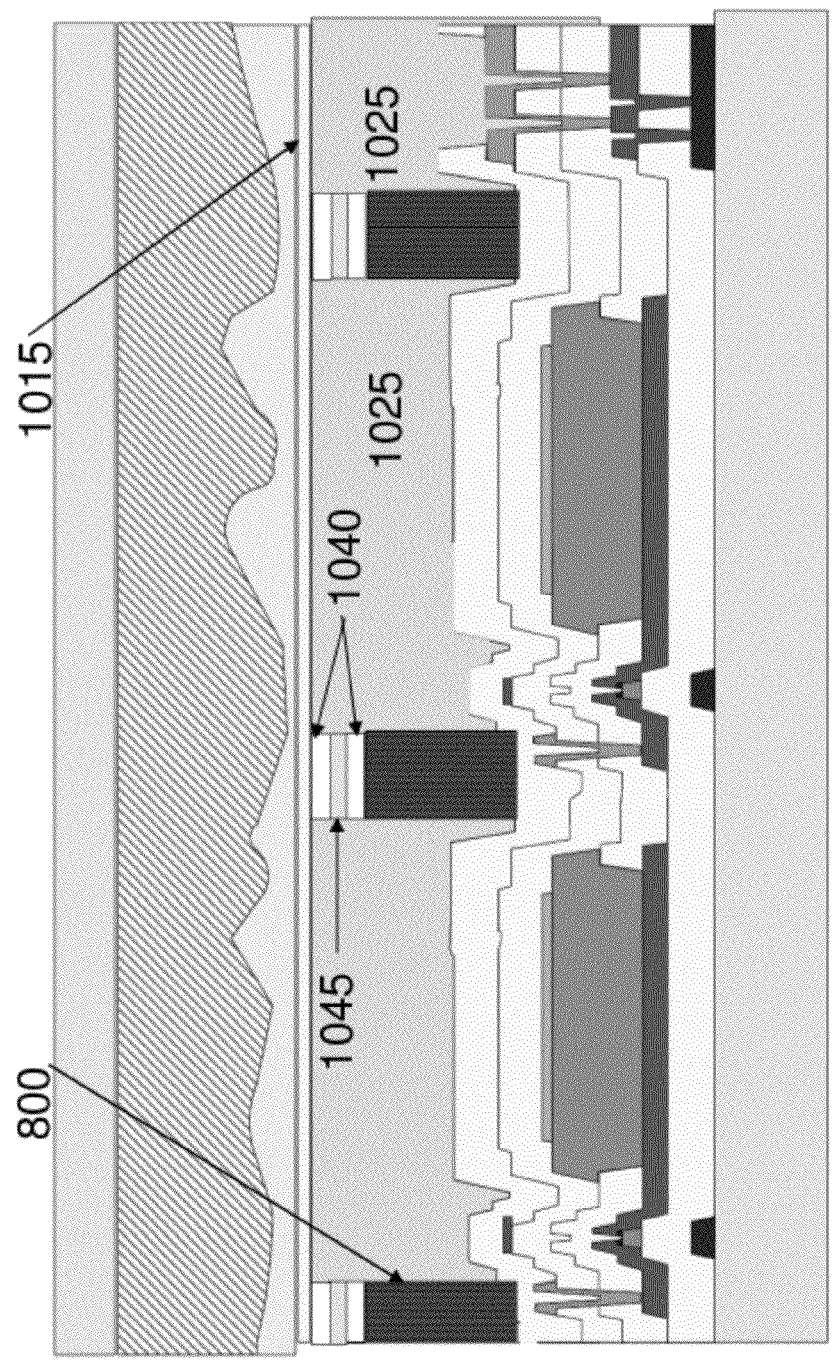
FIG. 10 is a diagram that shows a cross-sectional view of a combined scintillator and an imaging array with another embodiment of spacers, according to present teachings.

Additional embodiments of the spacers 800 can use multiple traces in a horizontal (e.g., a first direction) direction, in a vertical (e.g., a second direction) direction or multiple conductors or traces in both horizontal and vertical directions. Some pixel architectures, such as active pixels, require multiple bias and clock lines. For example, a 3T (three transistor) active pixel architecture can use traces for 3 bias voltage lines, 2 clock lines and 1 readout line. Exemplary embodiments of spacers 800 can allow multiple stacked insulated metal traces (e.g., 5) over at least a top surface of the spacers 800. As illustrated in FIG. 10, one embodiment of the spacers 800 can provide a plurality of stacked metal traces 1040 on spacer 800. The stacked metal traces can be separated by an insulator such as insulating layer 1045. Similar to embodiments described herein, each of the stacked metal tracers can be electrically connected within the pixels 700 or imaging array 775. As shown in FIG. 10, and optional optically indexed material layer 1025 and an optional protective layer 1015 can be used.

In alternative additional embodiments, the component of the imaging array 775 or digital detector 790 on the spacers 800 can include additional elements of pixels, TFTs, or additional components for use by the digital detector. Such examples of the component can be limited only by corresponding size limitations of the spacers 800 dimensions. Such examples of the component at the spacers 800 can include but are not limited to capacitors, diodes, amplifiers, or the like. In one embodiment, optically transparent adhesive materials can be used to couple components at the spacers 800 to the scintillator 710.

Figure 14:
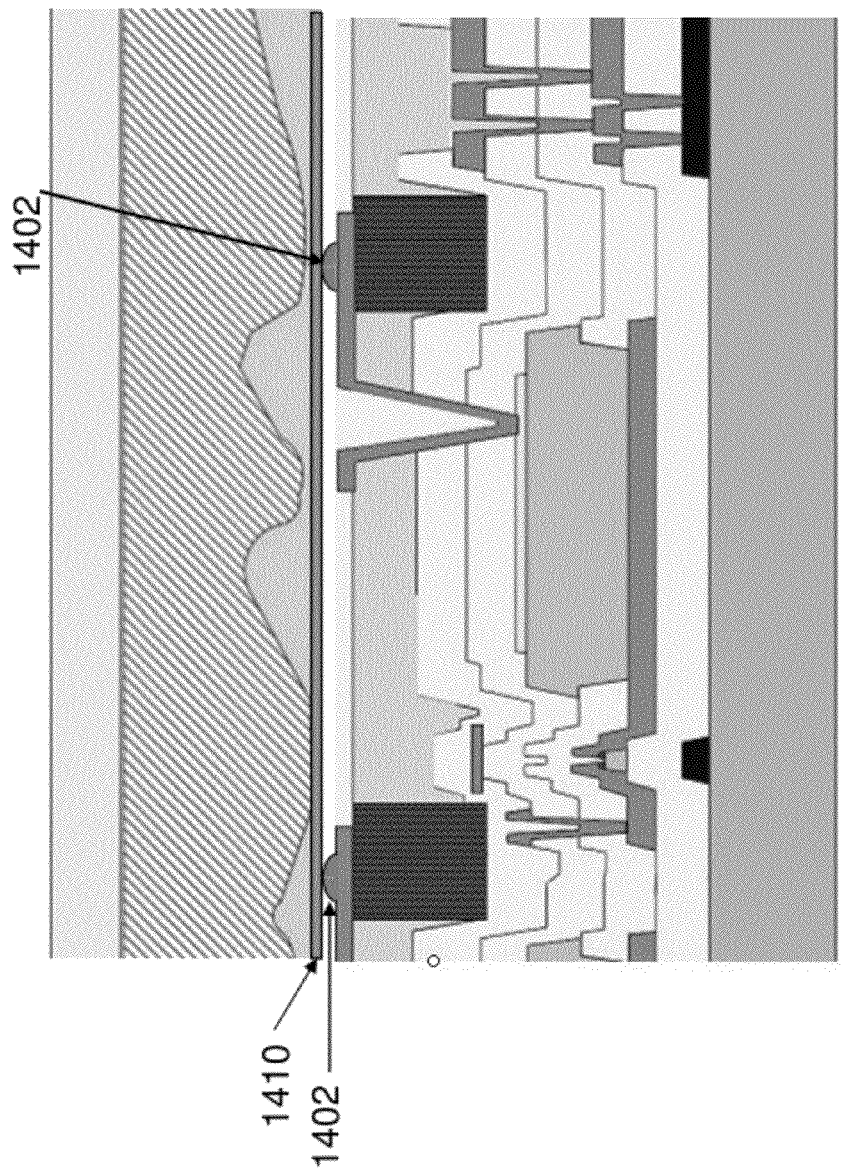
FIG. 14 is a diagram that shows a cross-sectional view of a combined scintillator and an imaging array with exemplary spacers and an exemplary conductor coupled to the scintillator, according to present teachings.

In one embodiment, a sheet (e.g., uniform layer, evaporation deposited layer, solution coated layer) of a transparent conductor 1410 (e.g., Indium-tin oxide (ITO), Indium zinc tin oxide (IZTO)) can be put over the scintillator 710. Then, on each spacer 800, a contact or bump 1402 can electrically connect the transparent conductor 1410 to the bias line 810 of the array 775 (e.g., photodiode). For example, the layer of transparent conductor 1410 is preferable common to all bias electrodes in the array 775. A bias voltage source can be connected to the conductor 1410 adjacent to or nearby the imaging array. Accordingly, the resistance of the bias line (e.g., 8 microns wide by 40 inches wide, about 50,000 ohms) can be reduced to about hundreds of ohms, which can be the resistance from the edge to a center portion of to an ITO sheet (e.g., 40 inches by 30 inches). As shown in FIG. 14, in one embodiment, a low resistance bias line can be used. Since the bias line can be clocked in array 775 operations, preferably, the bias line can have a fast rise time and fast fall time, and/or a low impedance connection to reduce or limit noise (e.g., high frequency noise coupling). Further, because in the embodiment, shown in FIG. 14 the transparent conductor is a sheet, a subset of the bumps can be missed without affecting an overall resistance of the bias line. Alternatively, the ITO conductor 1410 can be strips to connect a single or multiple rows/columns of pixels. In one embodiment, multiple strips of the ITO conductor 1410 can be formed to connect within each of a plurality of pixels (e.g., in a row or column) to provide access to different voltage levels or sources (e.g., Vbias, Vsupply, Vground, etc.) using the ITO conductor 1410. Each strip of the ITO conductor 1410 can have multiple contact points within a pixel. Exemplary strips formed in the ITO conductor 1410 can be formed in parallel or in crossing patterns insulated at potential intersections therebetween.

In one embodiment, contract 1402 can act as an adhesive to attach the ITO sheet to the spacers 800 and operate as the electrical contact. For example, pressed gold contacts or indium contacts are an example of a material that can be used for the contact or bump 1402 because such materials are soft enough (e.g., compressible) to provide press contact adhesion between the array 775 and the scintillator 710. An exemplary transparent conductor 1410 can be 0.1 micron to 1 micron to 5 microns thick.

For portable digital radiography, there is often no communication between the X-ray generator and the detector. As a result, the detector (e.g., digital detector 790) does not have timing information related to the start of X-ray exposure or the end of X-ray exposure of the X-ray generator. Embodiments of spacers 800 can include a sensor or the like formed at the spacers 800 that can be configured to detect a start of X-ray exposure or an end of X-ray exposure by the X-ray generator. Further, a plurality of photosensors on the spacers 800 can be connected in a prescribed relationship, a column-wise pattern, a row-wise pattern or an area-wise pattern and can be configured to detect the start or the end of X-ray exposure.

Figure 11:
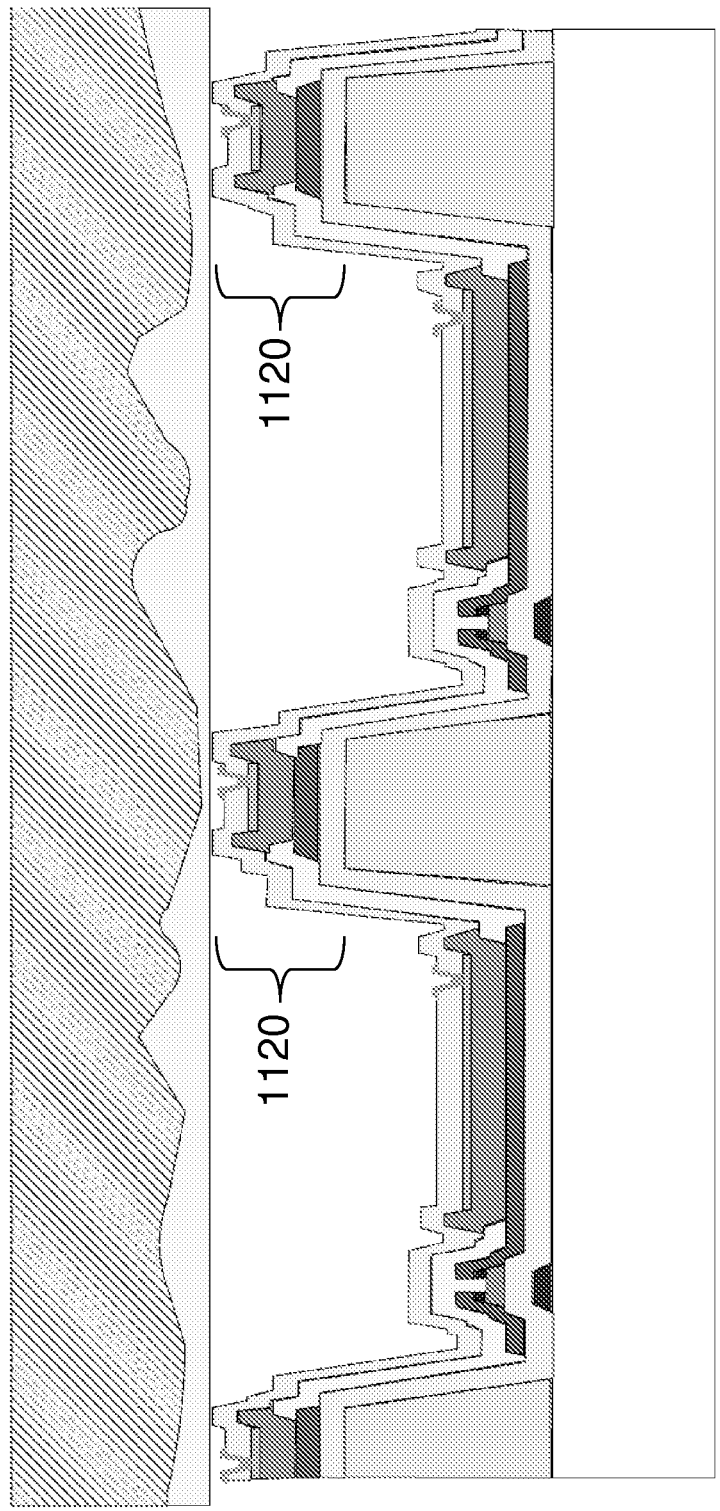
FIG. 11 is a diagram that shows a cross-sectional view of a combined scintillator and an imaging array with exemplary spacers that include a photodiode on a top surface along a perimeter of each pixel, according to present teachings.

FIG. 11 is a diagram that shows a cross-sectional view of a combined scintillator and an imaging array with exemplary spacers that include a photosensor on a top surface. As shown in FIG. 11, a photosensor on the spacers 800 can be incorporated into the imaging array 775 or the digital detector 790. In one embodiment, spacers 800 can have a height greater than the topography within the pixel 700 and photodiodes 1120 can be fabricated on the spacers 800 between pixels 700. Alternatively, the photosensors (e.g., photodiodes 1120) can be fabricated on the spacers 300 described herein.

An exemplary method for manufacturing the photodiodes 1120 will now be described, although embodiments of the application are not intended to be limited thereby. For example, after fabrication of the thin-film transistor switch (e.g., readout circuit 740) in the imaging array 775, photodiodes can be fabricated both within the pixel (e.g., photosensors 750) connected to one terminal of the TFT switch and on top (e.g., photodiodes 1120) of the spacers 800 between pixels 700. In exemplary embodiments, the photodiodes 1120 can be connected in rows, in columns, in paxels or globally in a grid pattern.

In operation, current in the grid-shaped photodiodes 1120 on the spacers 800 between pixels 700 can be monitored (e.g., during X-ray exposure). For example, the photodiodes 1120 on the spacers 800 can be connected in turn to amplifiers connected to a processor or controller of the digital detector 790 through read out electronics of the imaging array 775. Upon the start of X-ray exposure by the X-ray generator, the photocurrent in a large area grid photodiode (e.g., a plurality of electrically connected photodiodes 1120 or row of connected photodiodes 1120) can be sensed and the integrated digital detector 790 can be prepared to integrate charge, such as by turning off the TFT switches in the pixels 700. When the X-ray exposure stops, the photocurrent in the large area grid photodiode (e.g., a plurality of electrically connected photodiodes 1120) ceases and the integrated digital detector 790 can be prepared to trigger readout of a the imaging array 775 such as by selective turning on of the TFT switches to correspondingly read out individual pixels 700. Thus, one or more photosensors on the spacers 800 can be configured to detect the start and the end of X-ray exposure or transition the imaging array 775 between operating modes (e.g., idle mode, exposure mode, readout mode).

A number of embodiments to connect subsets of the photodiodes 1120 (e.g., a grid-shaped photodiode) can be used and can be selected according to specific applications of the digital detector 790. Exemplary embodiments for connecting the photodiodes 1120 can include, but are not limited to photodiodes 1120 such as row-wise connection only or column-wise connection only, so that rows of photosensors or columns of photosensors can be monitored individually. Such configurations can be used with wicked in optical indexed matched materials/fluids. Alternatively, the photosensors can be connected in segmented areas (e.g., paxels) to sense exposure in various regions of the image area. In one embodiment, a subset of connected photosensors on the spacers 800 can be segmented to match selectable exposure regions of the digital detector 790.

Further, various spacers 800 embodiments described herein can be used with the photosensors described herein. For example, the spacers 800 can be fabricated with opaque material to reduce or prevent light scattering from pixel to pixel. Alternatively, the metallilzation used to form either the anode or the cathode contact to the photodiode 1120 may be routed over the edge of the spacers 800 to reflect light, thereby reducing or preventing light scattering from pixel to pixel and increasing sensitivity. Alternatively, sides only of the spacers 800 can be reflective or a single surface (e.g., a top surface) can be absorptive/opaque. Further, exemplary spacers 300 can be used for the spacers 800.

Figure 12:
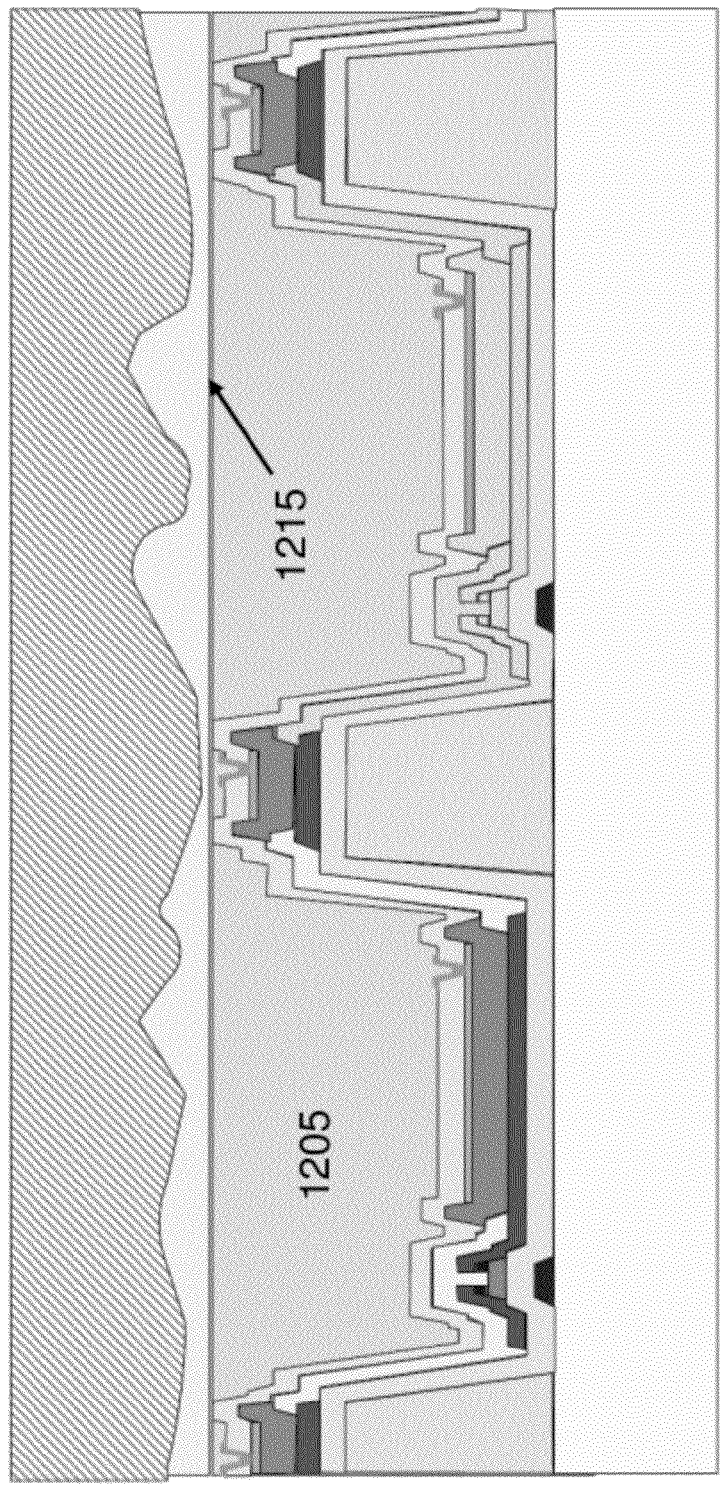
FIG. 12 is a diagram that shows a cross-sectional view of a cross-sectional view of a combined scintillator and an imaging array with exemplary spacers that include a photosensor on a top surface and areas therebetween include a transparent planarizing material, according to present teachings.

In one embodiment, additional optional layers can be used with the spacers 800. In exemplary embodiments, the regions between spacers 800 can be filled with an optically transparent material. FIG. 12 is a diagram that shows a cross-sectional view of a combined scintillator and imaging array where regions between the spacers 800 are filled with an optically transparent planarizing material 1205, such as BCB or acrylic. Further, an optional protective layer 1215 such as an encapsulating dielectric, such as silicon nitride, can be coated over the planarizing material to improve robustness to scratching.

In one embodiment, exemplary scintillator 110 can be coated with additional optional layers (e.g., a protective layer).

As will be obvious to one of ordinary skill in the art, the various embodiments can be combined to form many different combinations, all of which are intended to be incorporated by this disclosure. For example, following fabrication of the reflective spacers 800, deposition of a thin organic or inorganic encapsulating layer can be performed. This can serve to protect the reflective spacers 800 and prevent oxidation. Adhesive attachment to the scintillator 710 can be performed after a planarization layer or optical indexed matching material is deployed. Wicking in a fluid optical matching material can be performed.

Figure 13:
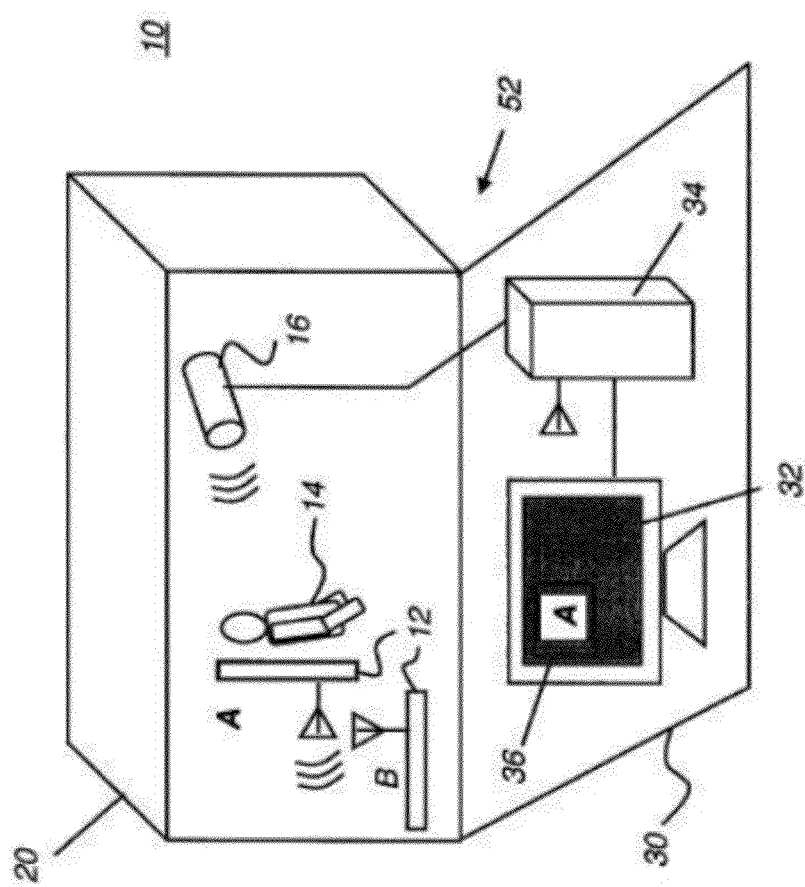
FIG. 13 is a block diagram showing an x-ray imaging room having two portable DR receiver panels.

Referring to FIG. 13, there is shown an x-ray imaging room 10 that has an X-ray apparatus 52 that uses two wireless DR receiver panels 12, one labeled A, the other labeled B. Each DR receiver panel 12 has an integrated controller/CPU as known in the art to control operations thereof. As described herein, digital detectors 190, 790 can be used for the DR receiver panel 12. Each DR receiver panel 12 has a unique identifying serial number or other encoding, typically assigned at time of manufacture. The wireless transmission protocol utilizes this unique encoding as a "signature" for distinguishing between any two or more DR receiver panels 12 from the same manufacturer and for setting up the proper communication channel between the panel and a controller 34.

Still referring to FIG. 13, X-ray imaging room 10 has an imaging room 20, a shielded area in which a patient 14 is imaged and containing an x-ray source 16, and a control room 30 that includes a display 32 and controller 34 for communicating with DR receiver panels 12 over a wireless interface and containing control logic for executing this function with a selected DR receiver panel 12. In the embodiment shown in FIG. 13, the image is obtained on the active DR receiver panel 12 labeled A; the DR receiver panel labeled B is inactive, not currently being used. An operator interface 36 accepts operator instructions such as to select a DR receiver panel, to communicate with the active DR receiver panel 12 labeled A, and control taking of a selected image of the patient 14. In the embodiment shown, display 32 is a touchscreen display, enabling the operator or technologist to easily control the X-ray imaging room 10 and select either the A or the B DR receiver panel 12 as the active DR receiver panel for obtaining the image using a graphical user interface (GUI).

While the invention has been illustrated with respect to one or more implementations, alterations and/or modifications can be made to the illustrated examples without departing from the spirit and scope of the appended claims. In addition, while a particular feature of the invention can have been disclosed with respect to only one of several implementations, such feature can be combined with one or more other features of the other implementations as can be desired and advantageous for any given or particular function. The term "at least one of" is used to mean one or more of the listed items can be selected. The term "about" indicates that the value listed can be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A projection radiographic imaging apparatus, comprising:
   a scintillator;
   an imaging array comprising a plurality of pixels formed over a substrate; and
   spacers disposed between a surface of the imaging array and the scintillator, wherein a component of the imaging array is over at least one of the spacers.

2. The apparatus of claim 1 wherein the component is a conductor connected to one or more terminals within one or more pixels, to provide an electrical connection from a periphery of the imaging array to one or more pixels.

3. The apparatus of claim 1 wherein the component increases a fill factor of an active area of the imaging array to the scintillator.

4. The apparatus of claim 1 wherein the component is a bias line to provide a bias voltage to one terminal of a photosensor.

5. The apparatus of claim 1 wherein a transparent conductor sheet is positioned below the scintillator and connected to a bias voltage source, wherein the transparent conductor sheet is electrically connected to a bias line in a row or column of pixels.

6. The apparatus of claim 1 wherein the component comprises clock lines arranged in a row-wise layout to provide clock signals for row select gates within the pixel or the component comprises data lines arranged in a column-wise layout to provide data readout from pixels.

7. The apparatus of claim 1 wherein the component comprises photosensitive elements disposed between a plurality of spacers and the scintillator.

8. The apparatus of claim 7, wherein the photosensitive elements form a grid between pixels, where anodes and cathodes of the photosensitive elements are connected globally.

9. The apparatus of claim 7, comprising a current sensing circuit connected to terminals of one or more of the photosensing elements.

10. The apparatus of claim 9 wherein the current sensing circuit senses a start of radiation exposure or senses an end of radiation exposure.

11. The apparatus of claim 9, comprising a radiographic detector to enclose the scintillator, the spacers and the imaging array, wherein the current sense signal is used to change a mode of operation of the radiographic detector from a quiescent state to a charge integrating state or to change the mode of operation of the radiographic detector from the charge integrating state to a charge readout state.

12. The apparatus of claim 9, comprising signal conditioning circuits for the imaging array, wherein the current sense signal is used to change a mode of operation of the signal conditioning circuits.

13. The apparatus of claim 1, further comprising photosensitive elements disposed over surfaces of the spacers, wherein the plurality of spacers control spacing between a surface of the scintillator and the surface of the imaging array, wherein a height of each spacer is greater than the height of an active surface of the imaging array and a variation in height of a surface of the scintillator facing the imaging array.

14. The apparatus of claim 1, comprising:
   a plurality of cavities formed by the imaging array, the scintillator, and the plurality of spacers; and
   an optically transparent material at least partially disposed in each cavity.

15. The apparatus of claim 1, where the spacer is a part of the imaging array, where the component is below an encapsulation layer of the imaging array.

16. A method of manufacturing a radiographic imaging apparatus comprising:
   forming an imaging array comprising a plurality of pixels formed on a substrate;
   forming a plurality of spacers disposed over a first surface of the imaging array;
   forming components of the radiographic imaging apparatus over an upper surface of the spacers; and
   positioning a scintillator over the components and over the plurality of spacers.

17. The method of claim 16, wherein the component is a bias line to provide a bias voltage to one terminal of a photosensor, clock lines to provide clock signals to pixels, gate lines arranged in a row-wise layout to select gate electrodes within at least one pixel, or data lines arranged in a column-wise layout to provide data readout from a plurality of pixels.

18. The method of claim 16, wherein the component comprises photosensitive elements disposed between a plurality of spacers and the scintillator, further comprising:
   a current sensing circuit connected to terminals of one or more of the photosensing elements; and
   a radiographic detector to enclose the scintillator, the spacers and the imaging array, wherein a signal from the current sensing circuit is operative to change a mode of operation of the radiographic detector from a quiescent state to a charge integrating state or to change the mode of operation of the radiographic detector from the charge integrating state to a charge readout state.

19. The method of claim 16, comprising:
   coating a planarization layer over the imaging array, the spacers and photosensors on the spacers; and
   forming a layer of hardness greater than the planarization layer between the planarization layer and the scintillator.

20. The apparatus of claim 16, wherein the plurality of spacers are positioned on inactive portions of the first surface of the imaging array to define a space between a surface of the scintillator and the first surface of the imaging array, wherein the height of each spacer is greater than the height of the first surface of the imaging array, wherein the plurality of spacers to extend along at least a portion of a perimeter of a plurality of pixels or to form a periodic pattern of around the perimeter of the plurality of pixels, wherein the plurality of spacers comprise a material to reduce transmission of light between adjacent pixels, and wherein the plurality of spacers comprise an anisotropic structure to provide increased lateral movement relative to vertical movement of the spacers.

21. A projection radiographic imaging apparatus, comprising:
   a scintillator;
   an imaging array comprising a plurality of pixels formed over a substrate; and
   spacers disposed between a surface of the imaging array and the scintillator, wherein a portion of a component of the imaging array is over at least one of the spacers, where a first part of the component is over a corresponding spacer and a second part to the component is connected within an adjacent pixel.

* * * * *